US012106811B2

(12) United States Patent
Hagiwara et al.

(10) Patent No.: US 12,106,811 B2
(45) Date of Patent: Oct. 1, 2024

(54) SEMICONDUCTOR MEMORY DEVICE

(71) Applicant: Kioxia Corporation, Tokyo (JP)

(72) Inventors: Yousuke Hagiwara, Kawasaki Kanagawa (JP); Kei Shiraishi, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 264 days.

(21) Appl. No.: 17/882,459

(22) Filed: Aug. 5, 2022

(65) Prior Publication Data

US 2023/0317178 A1    Oct. 5, 2023

(30) Foreign Application Priority Data

Mar. 31, 2022    (JP) .................................. 2022-058234

(51) Int. Cl.
| | |
|---|---|
| *G11C 7/00* | (2006.01) |
| *G11C 16/04* | (2006.01) |
| *G11C 16/26* | (2006.01) |
| *G11C 16/30* | (2006.01) |
| *G11C 16/32* | (2006.01) |

(52) U.S. Cl.
CPC .......... *G11C 16/32* (2013.01); *G11C 16/0483* (2013.01); *G11C 16/26* (2013.01); *G11C 16/30* (2013.01)

(58) Field of Classification Search
CPC ......... G11C 7/1006; G11C 7/14; G11C 7/062; G11C 7/22
USPC .................................................... 365/189.07
See application file for complete search history.

(56) References Cited

U.S. PATENT DOCUMENTS

| | | | |
|---|---|---|---|
| 6,320,438 B1 | 11/2001 | Arcus | |
| 9,590,628 B2 * | 3/2017 | Kang | ........................ G11C 7/14 |
| 2019/0228826 A1 | 7/2019 | Yamamoto et al. | |
| 2020/0185044 A1 | 6/2020 | Takada et al. | |

FOREIGN PATENT DOCUMENTS

| | | |
|---|---|---|
| JP | 2019128829 A | 8/2019 |
| JP | 2020091798 A | 6/2020 |

* cited by examiner

*Primary Examiner* — Son T Dinh
(74) *Attorney, Agent, or Firm* — Holtz, Holtz & Volek PC

(57) ABSTRACT

A semiconductor memory device includes a comparator that outputs a signal switched in synchronism with a read enable signal from outside and outputs the signal, and a correction circuit that adjusts the duty cycle of the signal. The correction circuit includes a variable current source connected to a first output portion of the comparator, and a variable current source connected to a second output portion of the comparator, and adjusts the amounts of current output from the current sources to adjust the duty cycles of signals.

15 Claims, 24 Drawing Sheets

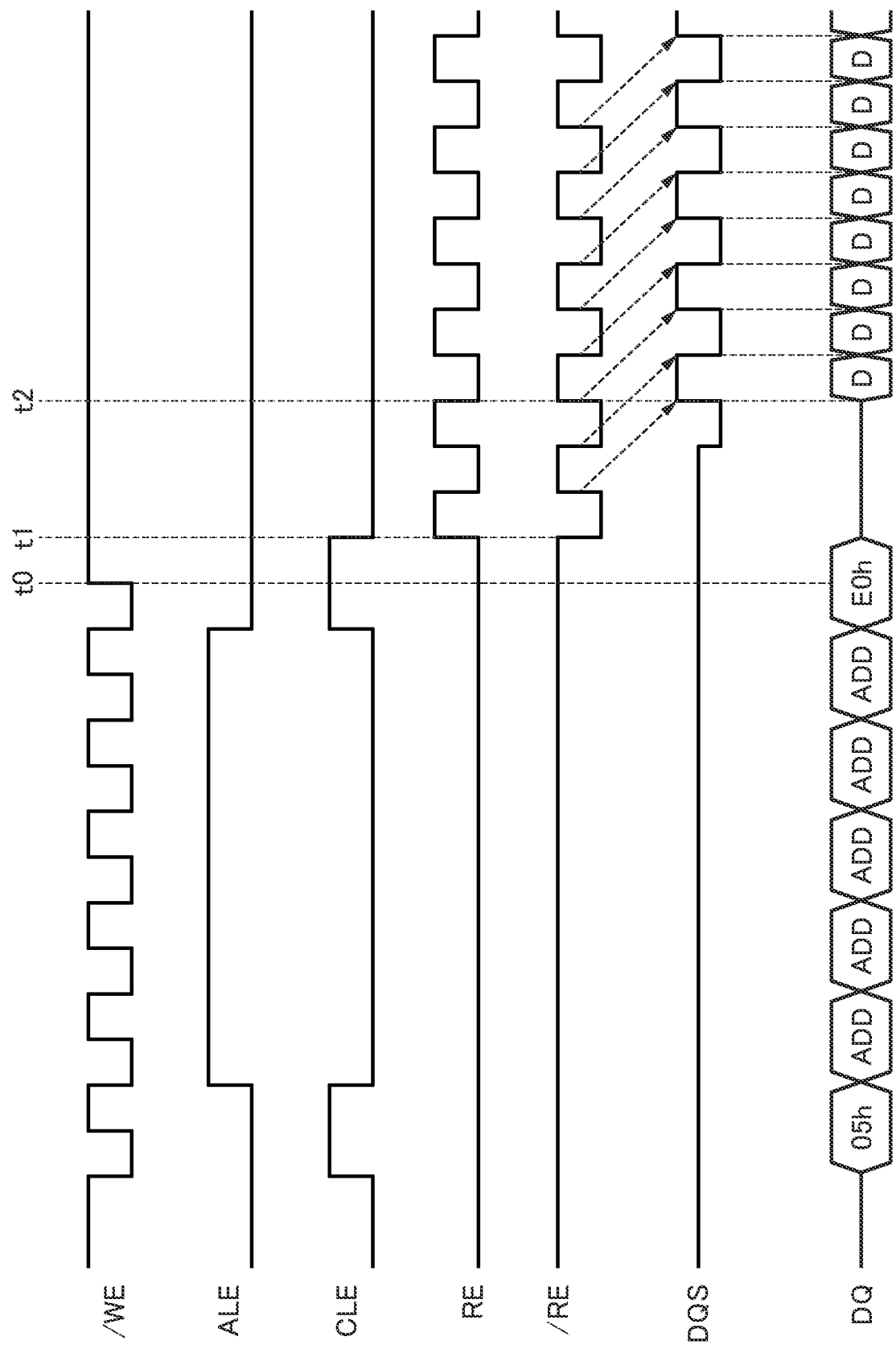

FIG.14

| | CODE_RE [2:0] | | |
|---|---|---|---|
| a | 0 | 0 | 0 |
| b | 0 | 0 | 1 |
| c | 0 | 1 | 0 |
| d | 0 | 1 | 1 |
| e | 1 | 0 | 0 |
| f | 1 | 0 | 1 |
| g | 1 | 1 | 0 |
| h | 1 | 1 | 1 |

THE AMOUNT OF CURRENT: SMALL
↑
↓
THE AMOUNT OF CURRENT: LARGE

SEMICONDUCTOR MEMORY DEVICE

CROSS-REFERENCE TO RELATED APPLICATION

This application is based upon and claims the benefit of priority from Japanese Patent Application No. 2022-058234, filed on Mar. 31, 2022, the entire contents of which are incorporated herein by reference.

BACKGROUND OF THE INVENTION

Field of the Invention

Embodiments of the present invention relate to semiconductor memory devices.

Description of the Related Art

A semiconductor memory device, such as a NAND flash memory, for example, outputs read data in response to a signal transmitted from a memory controller. When outputting the read data, the semiconductor memory device also outputs a toggle signal for indicating the output timing.

BRIEF DESCRIPTION OF THE DRAWINGS

FIG. 10 is a chart illustrating examples of temporal changes in signals and the like transferred between a semiconductor memory device and a memory controller according to a comparative example;

FIG. 14 is a chart illustrating an example of a correction code;

DETAILED DESCRIPTION OF THE PREFERRED EMBODIMENTS

Hereinafter, the present embodiment will be described with reference to the accompanying drawings. For easy understanding of the description, identical components throughout the drawings are denoted by identical reference signs as much as possible, and overlapped description will be omitted.

Figure 1:
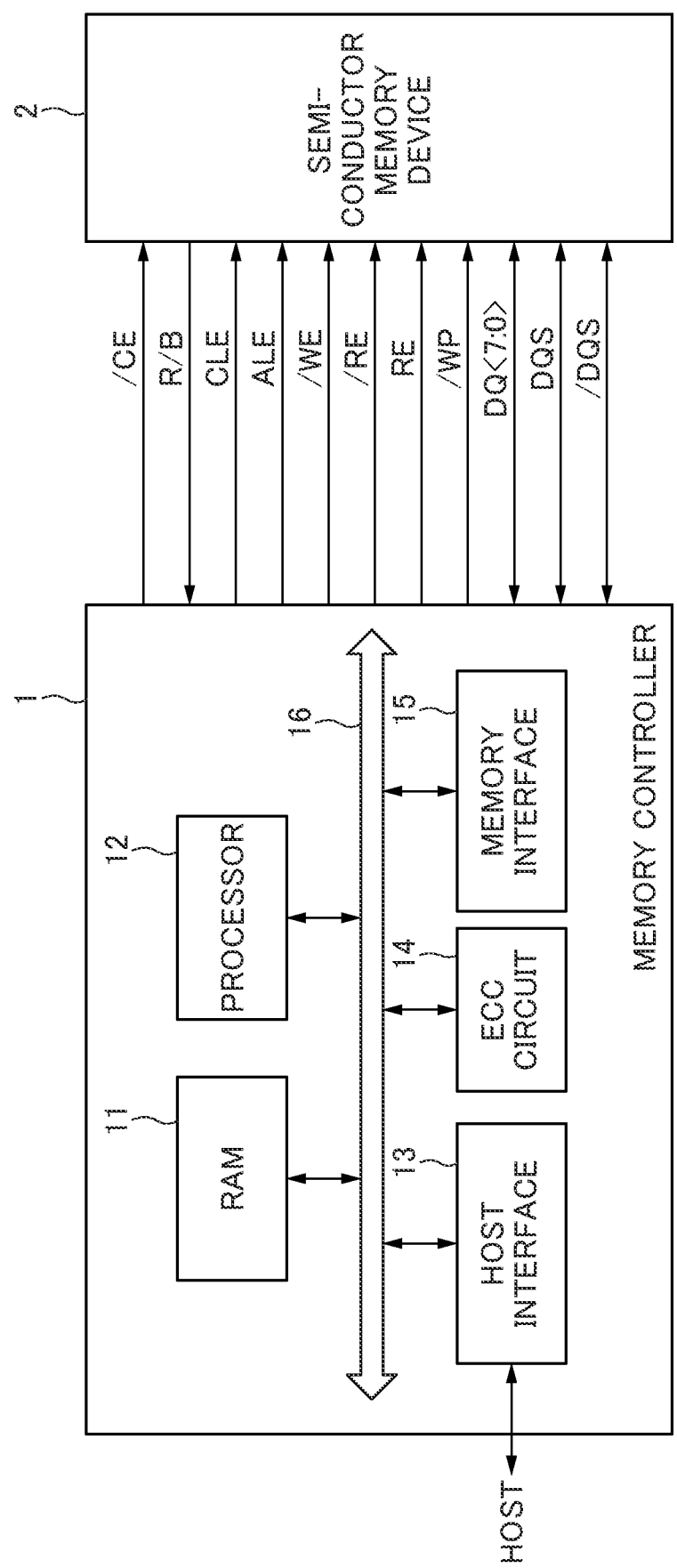
FIG. 1 is a block diagram illustrating an exemplary configuration of a memory system according to a first embodiment.

A first embodiment will be described. A semiconductor memory device 2 according to the present embodiment is a nonvolatile memory device configured as a NAND flash memory. FIG. 1 is a block diagram illustrating an exemplary configuration of a memory system including the semiconductor memory device 2. The memory system includes a memory controller 1 and the semiconductor memory device 2.

Figure 2:
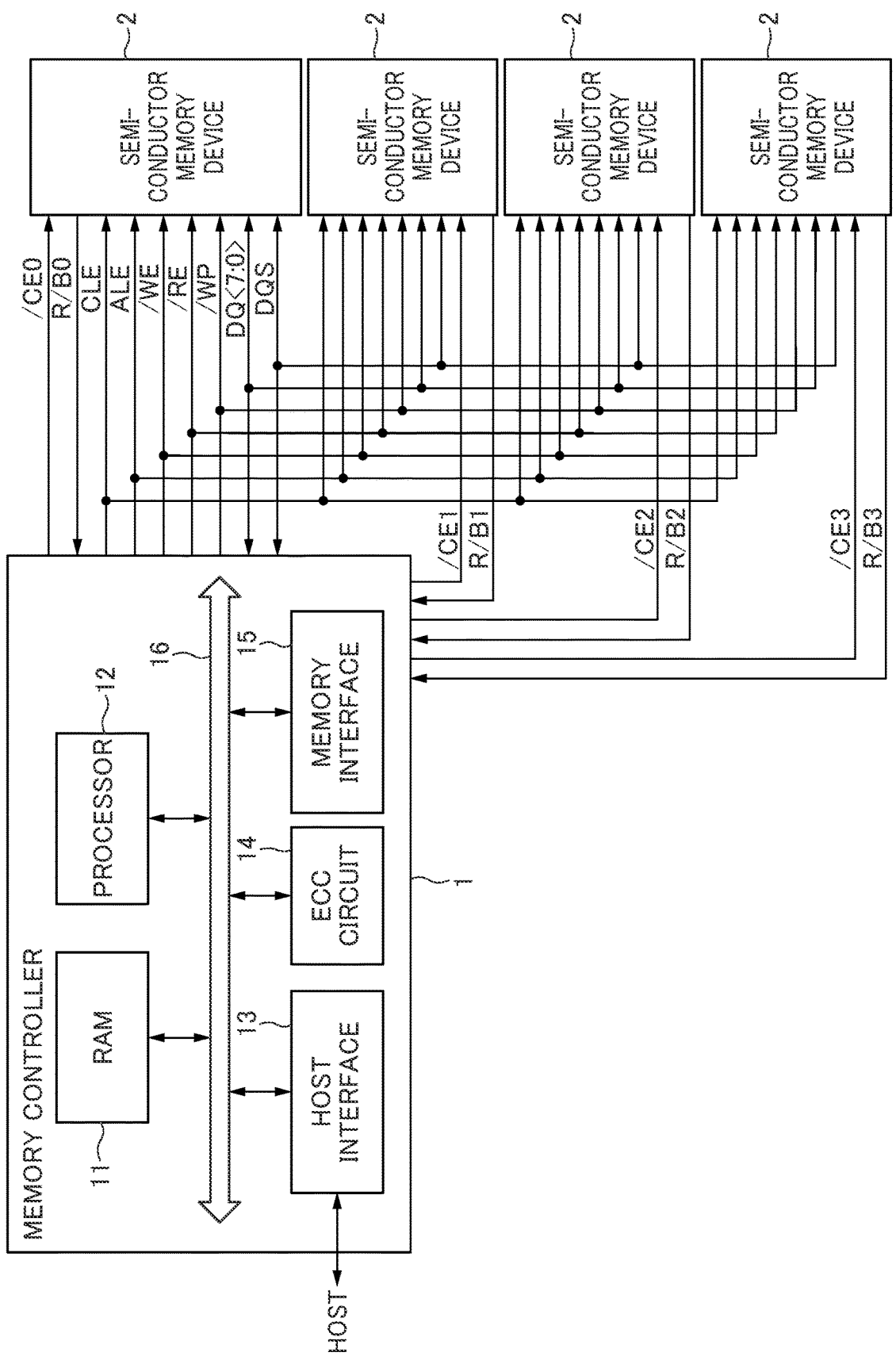
FIG. 2 is a block diagram illustrating an exemplary configuration of the memory system according to the first embodiment.

It should be noted that in the actual memory system, as illustrated in FIG. 2, a plurality of semiconductor memory devices 2 are provided for a single memory controller 1. In FIG. 1, only one of the plurality of semiconductor memory devices 2 is illustrated. A specific configuration of the semiconductor memory device 2 will be described below.

The memory system can be connected to a host (not illustrated). The host is an electronic device, such as a personal computer or a portable terminal, for example. The memory controller 1 controls data writing to the semiconductor memory device 2 in accordance with a write request from the host. In addition, the memory controller 1 controls data reading from the semiconductor memory device 2 in accordance with a read request from the host.

Signals, such as a chip enable signal /CE, a ready/busy signal R/B, a command latch enable signal CLE, an address latch enable signal ALE, a write enable signal /WE, read enable signals /RE and RE, a write protect signal /WP, a signal DQ<7:0> as data, and data strobe signals DQS and /DQS, are transferred between the memory controller 1 and the semiconductor memory device 2.

The chip enable signal /CE is a signal for enabling the semiconductor memory device 2. The ready/busy signal R/B is a signal for indicating whether the semiconductor memory device 2 is in a ready state or a busy state. The "ready state" is a state in which an instruction from outside can be accepted. The "busy state" is a state in which an instruction from outside cannot be accepted.

As illustrated in FIG. 2, the chip enable signal /CE is individually transmitted to each of the plurality of semiconductor memory devices 2. In FIG. 2, each chip enable signal /CE is provided with a number at its end like "/CE0," for example, for distinguishing purposes.

Similarly, the ready/busy signal R/B is individually transmitted from each of the plurality of semiconductor memory devices 2. In FIG. 2, each ready/busy signal R/B is provided with a number at its end like "R/B0," for example, for distinguishing purposes.

Signals (e.g., the command latch enable signal CLE) other than the chip enable signal /CE and the ready/busy signal R/B are transferred between the memory controller 1 and the plurality of semiconductor memory devices 2 via signal lines used in common by the semiconductor memory devices 2. The memory controller 1 identifies the semiconductor memory device 2 as a communication target using the individual chip enable signal /CE.

The command latch enable signal CLE is a signal indicating that the signal DQ<7:0> is a command. The address latch enable signal ALE is a signal indicating that the signal DQ<7:0> is an address. The write enable signal /WE is a signal for introducing a received signal into the semiconductor memory device 2, and is asserted each time a command, an address, and data are received by the memory controller 1. The memory controller 1 instructs the semiconductor memory device 2 to take in the signal DQ<7:0> while the signal /WE is at the "L (Low)" level.

The read enable signal /RE is a signal for reading data from the semiconductor memory device 2 by the memory controller 1. The signal RE is a signal complementary to the signal /RE. Such signals are used to control the operation timing of the semiconductor memory device 2 for outputting the signal DQ<7:0>, for example. The write protect signal /WP is a signal for instructing the semiconductor memory device 2 to prohibit data writing thereto and data erasing therefrom. The signal DQ<7:0> is a data entity transferred between the semiconductor memory device 2 and the memory controller 1, and includes a command, an address, and data. The data strobe signal DQS is a signal for controlling the input/output timing of the signal DQ<7:0>. The signal /DQS is a signal complementary to the signal DQS.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are mutually connected via an internal bus 16.

The host interface 13 outputs to the internal bus 16 a request, user data (i.e., write data), and the like received from the host. In addition, the host interface 13 transmits to the host user data read from the semiconductor memory device 2, a response from the processor 12, and the like.

The memory interface 15 controls a process of writing user data and the like to the semiconductor memory device 2 and a process of reading user data and the like from the semiconductor memory device 2 based on an instruction from the processor 12.

The processor 12 integrally controls the memory controller 1. The processor 12 is a CPU or an MPU, for example. The processor 12, upon receiving a request from the host via the host interface 13, performs control in accordance with the request. For example, the processor 12 instructs the memory interface 15 to write user data and a parity to the semiconductor memory device 2 in accordance with a request from the host. In addition, the processor 12 instructs the memory interface 15 to read user data and a parity from the semiconductor memory device 2 in accordance with a request from the host.

The processor 12 determines a storage area (i.e., a memory area) in the semiconductor memory device 2 for user data stored in the RAM 11. The user data is stored in the RAM 11 via the internal bus 16. The processor 12 determines the memory area for page-based data (i.e., page data) as a write unit. Hereinafter, user data stored in one page of the semiconductor memory device 2 shall also be referred to as "unit data." Unit data is usually encoded and stored as a code word in the semiconductor memory device 2. In the present embodiment, encoding is not essential. The memory controller 1 may store unit data in the semiconductor memory device 2 without encoding it, but FIG. 1 illustrates a configuration in which encoding is performed as an exemplary configuration. If the memory controller 1 does not perform encoding, page data coincides with unit data. In addition, a single code word may be generated based on a single piece of unit data, or a single code word may be generated based on split data split from a single piece of unit data. Alternatively, a single code word may be generated using a plurality of pieces of unit data.

The processor 12 determines a memory area in the semiconductor memory device 2 as a write destination for each unit data. Each memory area in the semiconductor memory device 2 is assigned a physical address. The processor 12 manages each memory area as a write destination of unit data using the physical address. The processor 12 designates the determined memory area (i.e., physical address), and instructs the memory interface 15 to write user data to the semiconductor memory device 2. The processor 12 manages the correspondence between the logical address (i.e., the logical address managed by the host) of the user data and the physical address. The processor 12, upon receiving a read request including a logical address from the host, identifies the physical address corresponding to the logical address, and thus designates the physical address and instructs the memory interface 15 to read user data.

The ECC circuit 14 encodes the user data stored in the RAM 11 to generate a code word. In addition, the ECC circuit 14 decodes a code word read from the semiconductor memory device 2. The ECC circuit 14 detects an error in data and corrects the error using a checksum provided to the user data, for example.

The RAM 11 temporarily stores user data received from the host until it is stored in the semiconductor memory device 2, or temporarily stores data read from the semiconductor memory device 2 until it is transmitted to the host. The RAM 11 is a general-purpose memory, such as SRAM or DRAM, for example.

FIG. 1 illustrates an exemplary configuration in which the memory controller 1 includes each of the ECC circuit 14 and the memory interface 15. However, the ECC circuit 14 may be incorporated in the memory interface 15. Alternatively, the ECC circuit 14 may be incorporated in the semiconductor memory device 2. A specific configuration and arrangement of each component illustrated in FIG. 1 are not particularly limited.

When a write request is received from the host, the memory system in FIG. 1 operates as follows. First, the processor 12 temporarily stores the target data to be written in the RAM 11. Then, the processor 12 reads the data stored in the RAM 11 and inputs it to the ECC circuit 14. The ECC circuit 14 encodes the input data, and inputs the resulting code word to the memory interface 15. The memory interface 15 writes the input code word to the semiconductor memory device 2.

When a read request is received from the host, the memory system in FIG. 1 operates as follows. First, the memory interface 15 inputs a code word read from the semiconductor memory device 2 into the ECC circuit 14. Then, the ECC circuit 14 decodes the input code word, and stores the decoded data in the RAM 11. The processor 12 transmits the data stored in the RAM 11 to the host via the host interface 13.

Figure 3:
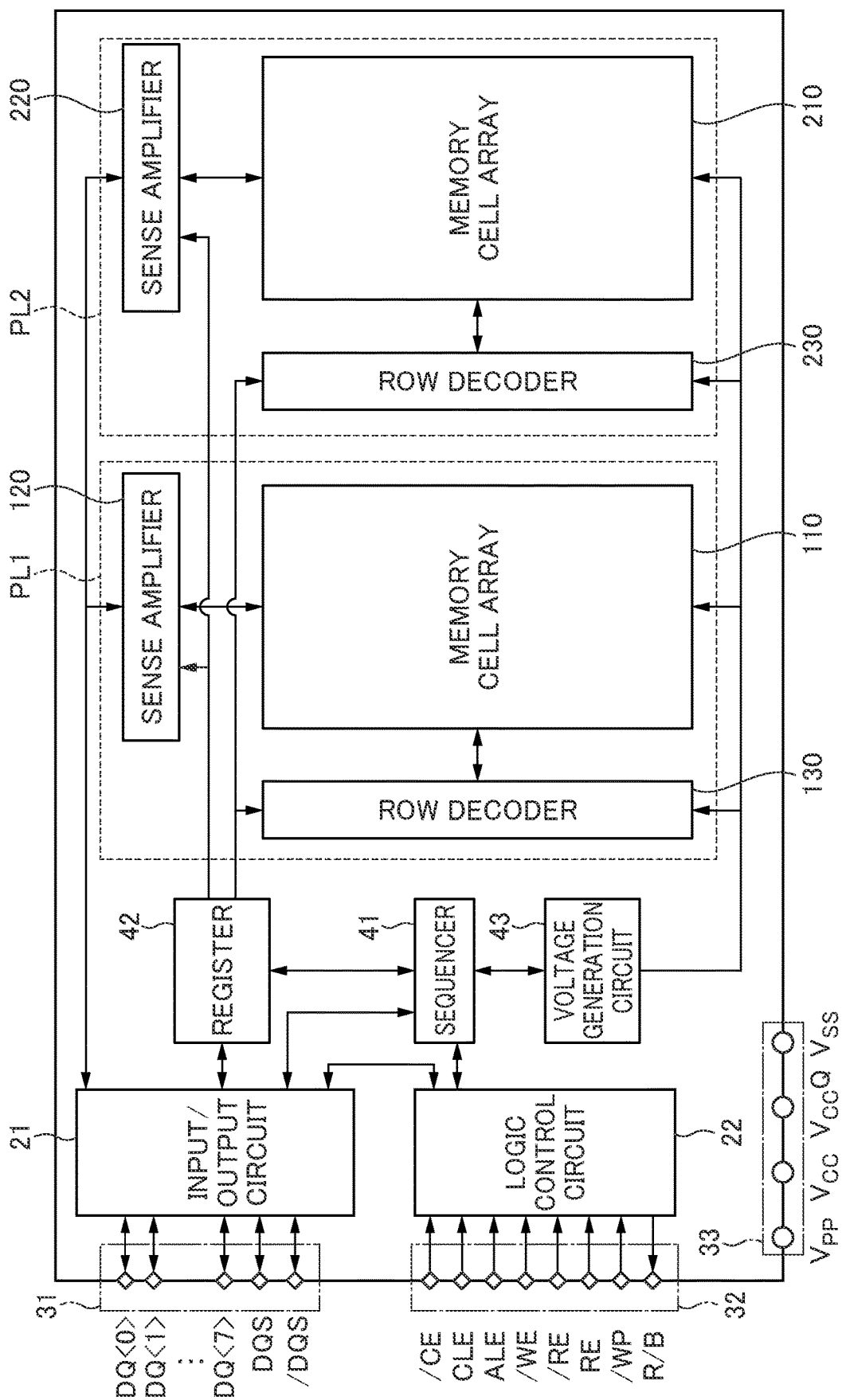
FIG. 3 is a block diagram illustrating the configuration of a semiconductor memory device according to the first embodiment.

The configuration of the semiconductor memory device 2 will be described. As illustrated in FIG. 3, the semiconductor memory device 2 includes two planes PL1 and PL2, an input/output circuit 21, a logic control circuit 22, a sequencer 41, a register 42, a voltage generation circuit 43, input/output pads 31, logic control pads 32, and power supply input terminals 33.

The plane PL1 includes a memory cell array 110, a sense amplifier 120, and a row decoder 130. The plane PL2 includes a memory cell array 210, a sense amplifier 220, and a row decoder 230. The configurations of the planes PL1 and PL2 are identical. That is, the configurations of the memory cell arrays 110 and 210 are identical, the configurations of the sense amplifiers 120 and 220 are identical, and the configurations of the row decoders 130 and 230 are identical. The number of planes provided in the semiconductor memory device 2 may be two as in the present embodiment, but may also be one or more than two.

Each of the memory cell arrays 110 and 210 is a portion for storing data. Each of the memory cell arrays 110 and 210 includes a plurality of memory cell transistors associated with word lines and bit lines. A specific configuration of such transistors will be described below.

The input/output circuit 21 transmits or receives the signal DQ<7:0> and the data strobe signals DQS and /DQS to/from the memory controller 1. The input/output circuit 21 transfers a command and an address in the signal DQ<7:0> to the register 42. In addition, the input/output circuit 21 transmits or receives data to be written or data to be read to/from the sense amplifier 120 or 220. The input/output circuit 21 includes both an input circuit (not illustrated) that receives a command and the like from the memory controller 1, and an output circuit 80 (not illustrated in FIG. 3; see FIG. 12) that outputs data to the memory controller 1.

The logic control circuit 22 receives from the memory controller 1 the chip enable signal /CE, the command latch enable signal CLE, the address latch enable signal ALE, the write enable signal /WE, the read enable signals RE and /RE, and the write protect signal /WP. In addition, the logic control circuit 22 transfers the ready/busy signal R/B to the memory controller 1 to inform the outside of the state of the semiconductor memory device 2.

Each of the input/output circuit 21 and the logic control circuit 22 is a circuit configured as a portion that receives or outputs a signal from/to the memory controller 1. That is, the input/output circuit 21 and the logic control circuit 22 are provided as interface circuits of the semiconductor memory device 2.

The sequencer 41 controls the operation of each portion, such as the planes PL1 and PL2 and the voltage generation circuit 43, based on a control signal input to the semiconductor memory device 2 from the memory controller 1. The sequencer 41 is a portion that controls the operation of each portion, such as the logic control circuit 22 and the memory cell arrays 110 and 210, and corresponds to a "control unit" of the semiconductor memory device 2.

The register 42 is a portion that temporarily holds a command and an address. The register 42 is also a portion that holds status information indicating the state of each of the planes PL1 and PL2. The status information is output to the memory controller 1 from the input/output circuit 21 as a state signal in response to a request from the memory controller 1.

The voltage generation circuit 43 is a portion that generates a voltage needed to perform each of a data write operation, a data read operation, and a data erase operation for the memory cell arrays 110 and 210 based on an instruction from the sequencer 41. Examples of such a voltage include a voltage, such as VPGM, VPASS_PGM, and VPASS_READ, applied to each word line WL described below and a voltage applied to each bit line BL described below. The voltage generation circuit 43 can individually apply a voltage to each of the word lines WL, the bit lines BL and the like so that the planes PL1 and PL2 can operate concurrently.

The input/output pads 31 are a portion where a plurality of terminals (i.e., pads) are provided for transferring signals between the memory controller 1 and the input/output circuit 21. Each terminal is individually provided corresponding to each of the signal DQ<7:0> and the data strobe signals DQS and /DQS.

The logic control pads 32 are a portion where a plurality of terminals (i.e., pads) are provided for transferring signals between the memory controller 1 and the logic control circuit 22. Each terminal is individually provided corresponding to each of the chip enable signal /CE, the command latch enable signal CLE, the address latch enable signal ALE, the write enable signal /WE, the read enable signals RE and /RE, the write protect signal /WP, and the ready/busy signal R/B.

The power supply input terminals 33 are a portion where a plurality of terminals are provided for receiving applied voltages needed for the operation of the semiconductor memory device 2. Examples of the voltages applied to the terminals include power supply voltages Vcc, VccQ, and Vpp and a ground voltage Vss.

The power supply voltage Vcc is a circuit power supply voltage provided as an operation power supply from the outside, and is a voltage of about 3.3 V, for example. The power supply voltage VccQ is a voltage of 1.2 V, for example. The power supply voltage VccQ is a voltage used to transfer signals between the memory controller 1 and the semiconductor memory device 2. The power supply voltage Vpp is a power supply voltage higher than the power supply voltage Vcc, and is a voltage of 12 V, for example.

To write data to or erase data from the memory cell arrays 110 and 210, a voltage as high as about 20 V (VPGM) is needed. At this time, it is possible to generate a desired voltage at a higher speed and with lower power consumption by boosting the power supply voltage Vpp of about 12 V than boosting the power supply voltage Vcc of about 3.3 V with a booster circuit in the voltage generation circuit 43. Meanwhile, when the semiconductor memory device 2 is used in an environment where it cannot be supplied with a high voltage, for example, the power supply voltage Vpp need not be supplied. Even if the power supply voltage Vpp is not supplied, the semiconductor memory device 2 can execute various operations as long as it is supplied with the power supply voltage Vcc. That is, the power supply voltage Vcc is a power supply that is normally supplied to the semiconductor memory device 2, while the power supply voltage Vpp is a power supply that is supplied additionally or optionally in accordance with the use environment, for example.

The configurations of the planes PL1 and PL2 will be described. It should be noted that as described previously, the configurations of the planes PL1 and PL2 are identical. Therefore, only the configuration of the plane PL1 will be described hereinafter, and the illustration and description of the configuration of the plane PL2 will be omitted.

Figure 4:
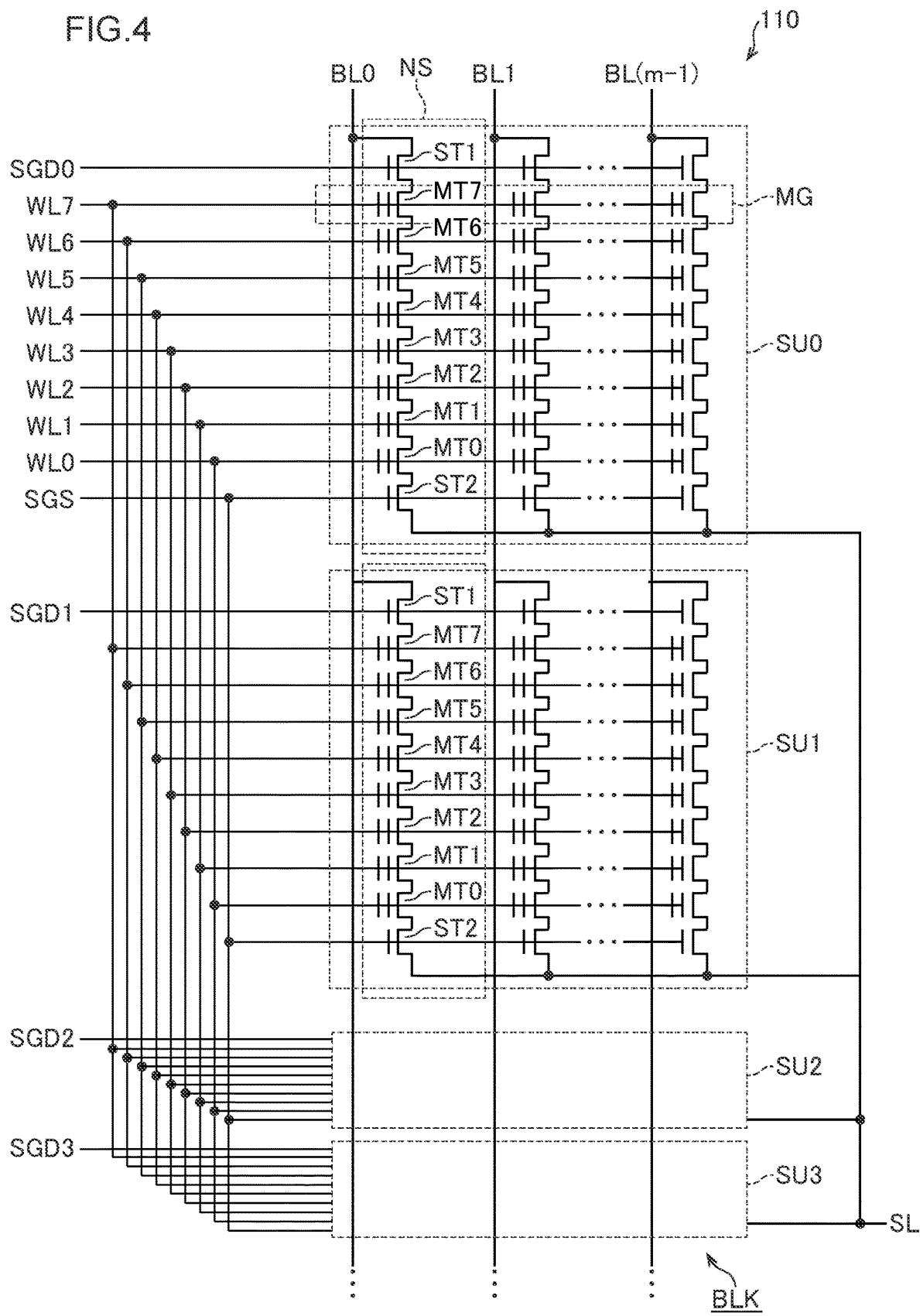
FIG. 4 is an equivalent circuit diagram illustrating the configuration of a memory cell array.

FIG. 4 illustrates an equivalent circuit diagram of the configuration of the memory cell array 110 provided in the plane PL1. The memory cell array 110 includes a plurality of blocks BLK, but FIG. 4 illustrates only one of the blocks BLK. The other blocks BLK of the memory cell array 110 have the same configuration as that illustrated in FIG. 4.

As illustrated in FIG. 4, the block BLK includes four string units SU (SU0 to SU3), for example. Each string unit SU includes a plurality of NAND strings NS. Each NAND string NS includes eight memory cell transistors MT (MT0 to MT7) and selection transistors ST1 and ST2, for example.

It should be noted that the number of the memory cell transistors MT is not limited to 8, and may be 32, 48, 64, or 96, for example. To enhance the cut-off characteristics, for example, each of the selection transistors ST1 and ST2 may be not a single transistor but a plurality of transistors. Further, dummy cell transistors may be provided between the memory cell transistors MT and the selection transistors ST1 and ST2.

The memory cell transistors MT are arranged so as to be connected in series between the selection transistors ST1 and ST2. The memory cell transistor MT7 on one end side is connected to the source of the selection transistor ST1, and the memory cell transistor MT0 on the other end side is connected to the drain of the selection transistor ST2.

The gates of the selection transistors ST1 in the string units SU0 to SU3 are respectively connected in common to selection gate lines SGD0 to SGD3. The gates of the selection transistors ST2 in the plurality of string units SU within an identical block BLK are connected in common to an identical selection gate line SGS. The gates of the memory cell transistors MT0 to MT7 within an identical block BLK are respectively connected in common to word lines WL0 to WL7. That is, the word lines WL0 to WL7 and the selection gate line SGS are used in common by the plurality of string units the SU0 to SU3 within an identical block BLK, while the selection gate lines SGD are individually provided for the respective string units SU0 to SU3 within an identical block BLK.

The memory cell array 110 is provided with m bit lines BL (BL0, BL1, . . . , BL(m−1)). The symbol "m" is an integer representing the number of NAND strings NS included in a single string unit SU. In each NAND string NS, the drain of the selection transistor ST1 is connected to the corresponding bit line BL. The source of the selection transistor ST2 is connected to a source line SL. The source line SL is connected in common to the sources of the plurality of selection transistors ST2 in the block BLK.

Data stored in the plurality of memory cell transistors MT within an identical block BLK are erased at a time. Meanwhile, data reading and data writing are performed at a time for the plurality of memory cell transistors MT connected to a single word line WL and belonging to a single string unit SU. Each memory cell can hold 3-bit data including a high-order bit, a middle-order bit, and a low-order bit.

That is, the semiconductor memory device 2 according to the present embodiment adopts the TLC method of storing 3-bit data in a single memory cell transistor MT as a method of writing data to the memory cell transistor MT. Instead of such a configuration, it is also possible to use the MLC method of storing 2-bit data in a single memory cell transistor MT as a method of writing data to the memory cell transistor MT, for example. The number of bits of data stored in a single memory cell transistor MT is not limited to a particular number.

It should be noted that in the following description, a set of 1-bit data stored in the plurality of memory cell transistors MT connected to a single word line WL and belonging to a single string unit SU shall be referred to as a "page." In FIG. 4, one of sets of the plurality of memory cell transistors MT is assigned a reference sign "MG."

When 3-bit data is stored in a single memory cell transistor MT as in the present embodiment, a set of a plurality of memory cell transistors MT connected to a common word line WL in a single string unit SU can store data of 3 pages. Among them, a page including a set of low-order bit data shall be hereinafter also referred to as a "low-order page," and data on the low-order page shall be hereinafter also referred to as "low-order page data." Similarly, a page including a set of middle-order bit data shall be hereinafter also referred to as a "middle-order page," and data on the middle-order page shall be hereinafter also referred to as "middle-order page data." A page including a set of high-order bit data shall be hereinafter also referred to as a "high-order page," and data on the high-order page shall be hereinafter also referred to as "high-order page data."

Figure 5:
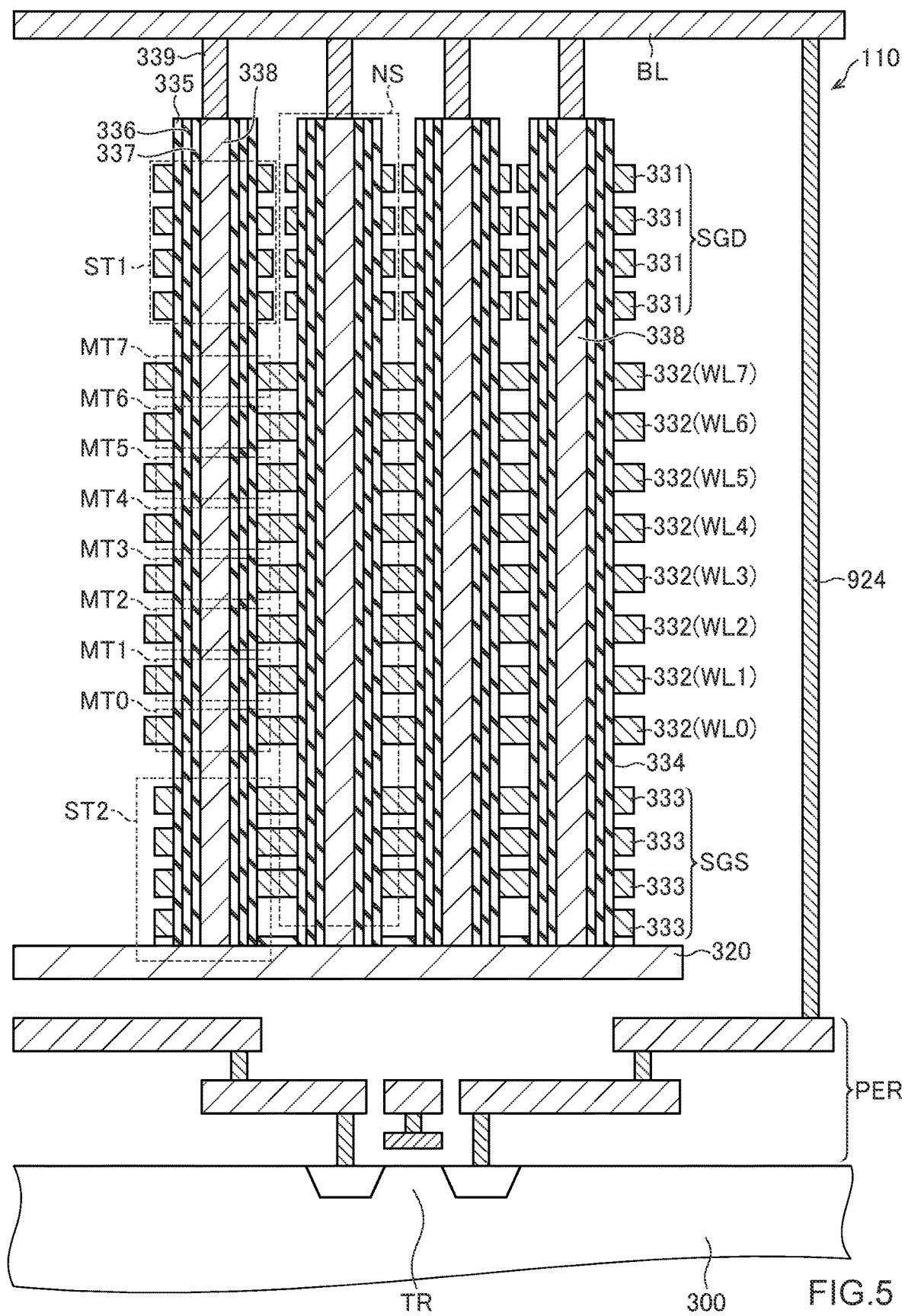
FIG. 5 is a cross-sectional view illustrating the configuration of the memory cell array.

FIG. 5 illustrates a schematic cross-sectional view of the configuration of the memory cell array 110 and its periphery. As illustrated in FIG. 5, in the memory cell array 110, a plurality of NAND strings NS are formed on a conductive layer 320. The conductive layer 320 is also referred to as a buried source line (BSL), and corresponds to the source line SL in FIG. 4.

A plurality of wire layers 333 functioning as the selection gate line SGS, a plurality of wire layers 332 functioning as the word lines WL, and a plurality of wire layers 331 functioning as the selection gate line SGD are stacked on the conductive layer 320. An insulating layer (not illustrated) is arranged between each of the stacked wire layers 333, 332, and 331.

A plurality of memory holes 334 are formed in the memory cell array 110. The memory holes 334 are holes penetrating the aforementioned wire layers 333, 332, and 331 as well as the insulating layers (not illustrated) arranged therebetween in the vertical direction, and reaching the conductive layer 320. A block insulating film 335, a charge storage layer 336, and a gate insulating film 337 are sequentially formed on a side face of each memory hole 334, and a conductive pillar 338 is further buried on the inner side thereof. The conductive pillar 338 is made of polysilicon, for example, and functions as a region in which channels are formed during the operation of the memory cell transistors MT and the selection transistors ST1 and ST2 included in each NAND string NS. In this manner, a pillar-like object, which includes the block insulating film 335, the charge storage layer 336, the gate insulating film 337, and the conductive pillar 338, is formed on the inner side of each memory hole 334.

A portion of the pillar-like object formed on the inner side of each memory hole 334, which intersects each of the stacked wire layers 333, 332, and 331, functions as a transistor. Specifically, a portion intersecting the wire layers 331 functions as the selection transistor ST1 of the plurality of transistors. Portions intersecting the wire layers 332 function as the memory cell transistors MT (MT0 to MT7)

of the plurality of transistors. A portion intersecting the wire layers 333 functions as the selection transistor ST2 of the plurality of transistors. According to such a configuration, the pillar-like object formed on the inner side of each memory hole 334 functions as the NAND string NS described with reference to FIG. 4. The conductive pillar 338 on the inner side of the pillar-like object is a portion functioning as the channels of the memory cell transistors MT and the selection transistors ST1 and ST2.

A wire layer functioning as the bit line BL is formed above the conductive pillar 338. The upper end of the conductive pillar 338 has formed thereon a contact plug 339 for connecting the conductive pillar 338 and the bit line BL.

A plurality of configurations similar to the configuration illustrated in FIG. 5 are arranged along the depth direction of the sheet of FIG. 5. A set of a plurality of NAND strings NS aligned along the depth direction of the sheet of FIG. 5 forms a single string unit SU.

In the semiconductor memory device 2 according to the present embodiment, a peripheral circuit PER is provided below the memory cell array 110, that is, at a position between the memory cell array 110 and a semiconductor substrate 300. The peripheral circuit PER is a circuit provided to achieve a data write operation, a data read operation, and a data erase operation, for example, for the memory cell array 110. The sense amplifier 120, the row decoder 130, the voltage generation circuit 43, and the like illustrated in FIG. 3 partially form the peripheral circuit PER. The peripheral circuit PER includes various transistors and an RC circuit, for example. In the example illustrated in FIG. 5, a transistors TR formed on the semiconductor substrate 300 and the bit line BL located above the memory cell array 110 are electrically connected via a contact 924.

It should be noted that instead of such a configuration, the memory cell array 110 may be provided directly on the semiconductor substrate 300. In such a case, a p-type well region of the semiconductor substrate 300 functions as the source line SL. In addition, the peripheral circuit PER is provided at a position adjacent to the memory cell array 110 along the surface of the semiconductor substrate 300.

Referring again to FIG. 3, the plane PL1 includes the sense amplifier 120 and the row decoder 130 in addition to the aforementioned memory cell array 110 as described previously.

The sense amplifier 120 is a circuit for adjusting a voltage applied to each bit line BL, and reading a voltage of each bit line BL and converting the read voltage into data. In reading data, the sense amplifier 120 acquires read data that has been read into a bit line BL from a memory cell transistor MT, and transfers the acquired read data to the input/output circuit 21. In writing data, the sense amplifier 120 transfers write data that has been written via a bit line BL to a memory cell transistor MT.

The row decoder 130 is a circuit configured as switches (not illustrated) each for applying a voltage to each word line WL. The row decoder 130 receives a block address and a row address from the register 42, and selects a corresponding block BLK based on the block address and also selects a corresponding word line WL based on the row address. Then, the row decoder 130 switches on/off of each switch so as to apply a voltage from the voltage generation circuit 43 to the selected word line WL.

Figure 6:
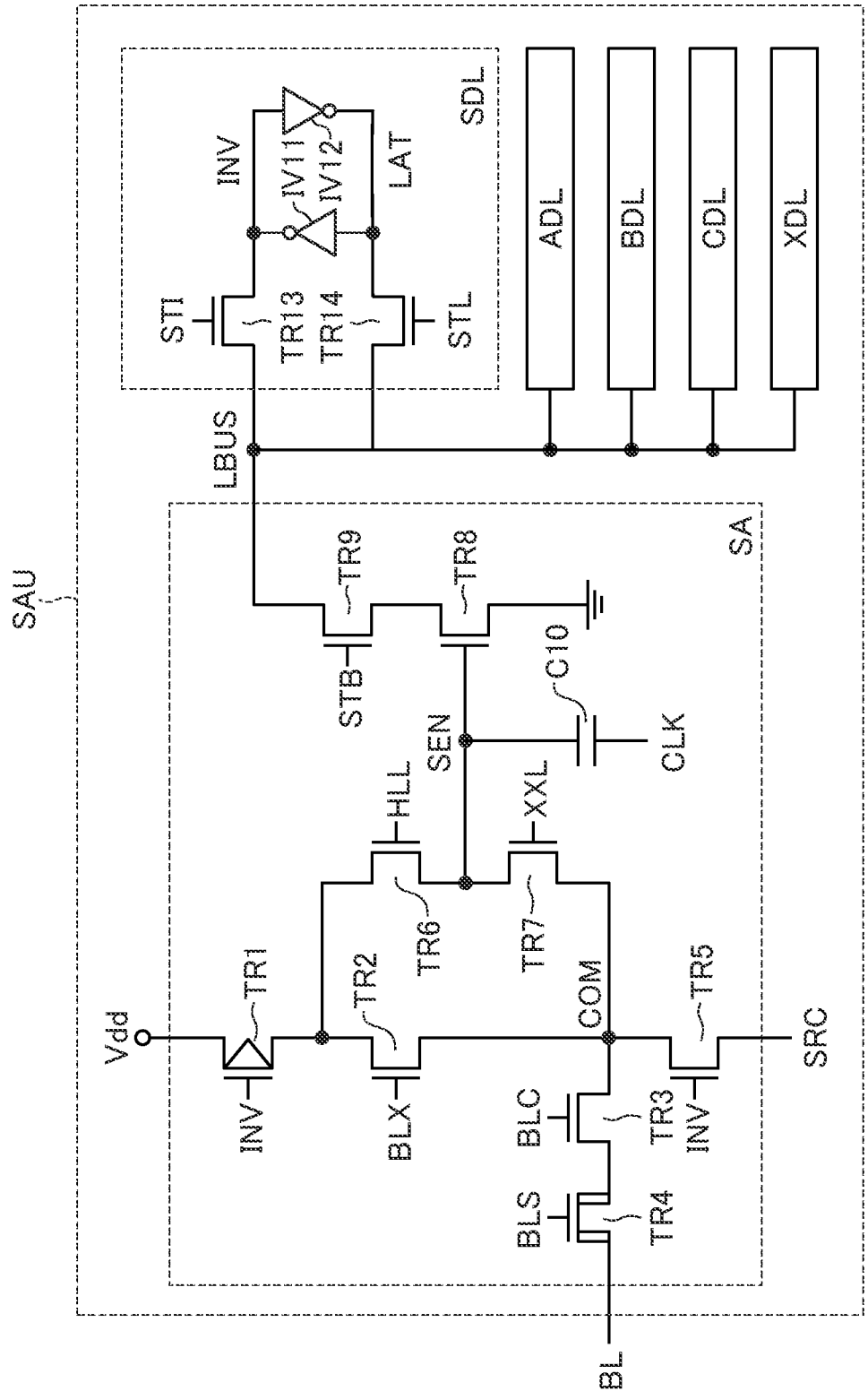
FIG. 6 is a diagram illustrating the circuit configuration of a sense amplifier unit.

FIG. 6 illustrates an exemplary configuration of the sense amplifier 120. The sense amplifier 120 includes a plurality of sense amplifier units SAU associated with the respective bit lines BL. FIG. 6 illustrates a detailed circuit configuration of one of such sense amplifier units SAU.

As illustrated in FIG. 6, the sense amplifier unit SAU includes a sense amplifier portion SA and latch circuits SDL, ADL, BDL, CDL, and XDL. The sense amplifier portion SA and the latch circuits SDL, ADL, BDL, CDL, and XDL are connected via a bus LBUS so as to allow data to be transferred therebetween.

In a read operation, for example, the sense amplifier portion SA senses data read into the corresponding bit line BL, and determines if the read data is "0" or "1." The sense amplifier portion SA includes a transistor TR1 as a p-channel MOS transistor, transistors TR2 to TR9 as n-channel MOS transistors, and a capacitor C10, for example.

One end of the transistor TR1 is connected to a power supply line, and the other end of the transistor TR1 is connected to the transistor TR2. The gate of the transistor TR1 is connected to a node INV in the latch circuit SDL. One end of the transistor TR2 is connected to the transistor TR1, and the other end of the transistor TR2 is connected to a node COM. The gate of the transistor TR2 receives a signal BLX. One end of the transistor TR3 is connected to the node COM, and the other end of the transistor TR3 is connected to the transistor TR4. The gate of the transistor TR3 receives a signal BLC. The transistor TR4 is a high-withstand-voltage MOS transistor. One end of the transistor TR4 is connected to the transistor TR3. The other end of the transistor TR4 is connected to the corresponding bit line BL. The gate of the transistor TR4 receives a signal BLS.

One end of the transistor TR5 is connected to the node COM, and the other end of the transistor TR5 is connected to a node SRC. The gate of the transistor TR5 is connected to the node INV. One end of the transistor TR6 is connected between the transistor TR1 and the transistor TR2, and the other end of the transistor TR6 is connected to a node SEN. The gate of the transistor TR6 receives a signal HLL. One end of the transistor TR7 is connected to the node SEN, and the other end of the transistor TR7 is connected to the node COM. The gate of the transistor TR7 receives a signal XXL.

One end of the transistor TR8 is grounded, and the other end of the transistor TR8 is connected to the transistor TR9. The gate of the transistor TR8 is connected to the node SEN. One end of the transistor TR9 is connected to the transistor TR8, and the other end of the transistor TR9 is connected to the bus LBUS. The gate of the transistor TR9 receives a signal STB. One end of the capacitor C10 is connected to the node SEN. The other end of the capacitor C10 receives a clock CLK.

The signals BLX, BLC, BLS, HLL, XXL, and STB are generated by the sequencer 41, for example. A voltage Vdd as an internal power supply voltage of the semiconductor memory device 2 is applied to the power supply line connected to one end of the transistor TR1, for example, and a voltage Vss as the ground voltage of the semiconductor memory device 2 is applied to the node SRC, for example.

The latch circuits SDL, ADL, BDL, CDL, and XDL temporarily hold the read data. The latch circuit XDL is connected to the input/output circuit 21, and is used for data input and output between the sense amplifier unit SAU and the input/output circuit 21. As the read data is held in the latch circuit XDL, the read data can be outputted from the input/output circuit 21 to the memory controller 1. For example, data read by the sense amplifier unit SAU is first stored in one of the latch circuits ADL, BDL, and CDL, and is then transferred to the latch circuit XDL and is output from the latch circuit XDL to the input/output circuit 21. Meanwhile, for example, data input to the input/output circuit 21 from the memory controller 1 is first transferred from the input/output circuit 21 to the latch circuit XDL, and is then transferred from the latch circuit XDL to one of the latch circuits ADL, BDL, and CDL.

The latch circuit SDL includes inverters IV11 and IV12 and transistors TR13 and TR14 as n-channel MOS transistors, for example. The input node of the inverter IV11 is connected to a node LAT. The output node of the inverter IV11 is connected to the node INV. The input node of the inverter IV12 is connected to the node INV. The output node of the inverter IV12 is connected to the node LAT. One end of the transistor TR13 is connected to the node INV, and the other end of the transistor TR13 is connected to the bus LBUS. The gate of the transistor TR13 receives a signal STI. One end of the transistor TR14 is connected to the node LAT, and the other end of the transistor TR14 is connected to the bus LBUS. The gate of the transistor TR14 receives a signal STL. For example, data held at the node LAT corresponds to the data held in the latch circuit SDL. Data held at the node INV corresponds to inverted data of the data held at the node LAT. The circuit configuration of each of the latch circuits ADL, BDL, CDL, and XDL is similar to that of the latch circuit SDL, for example. Thus, the description thereof is omitted herein.

Figure 7:
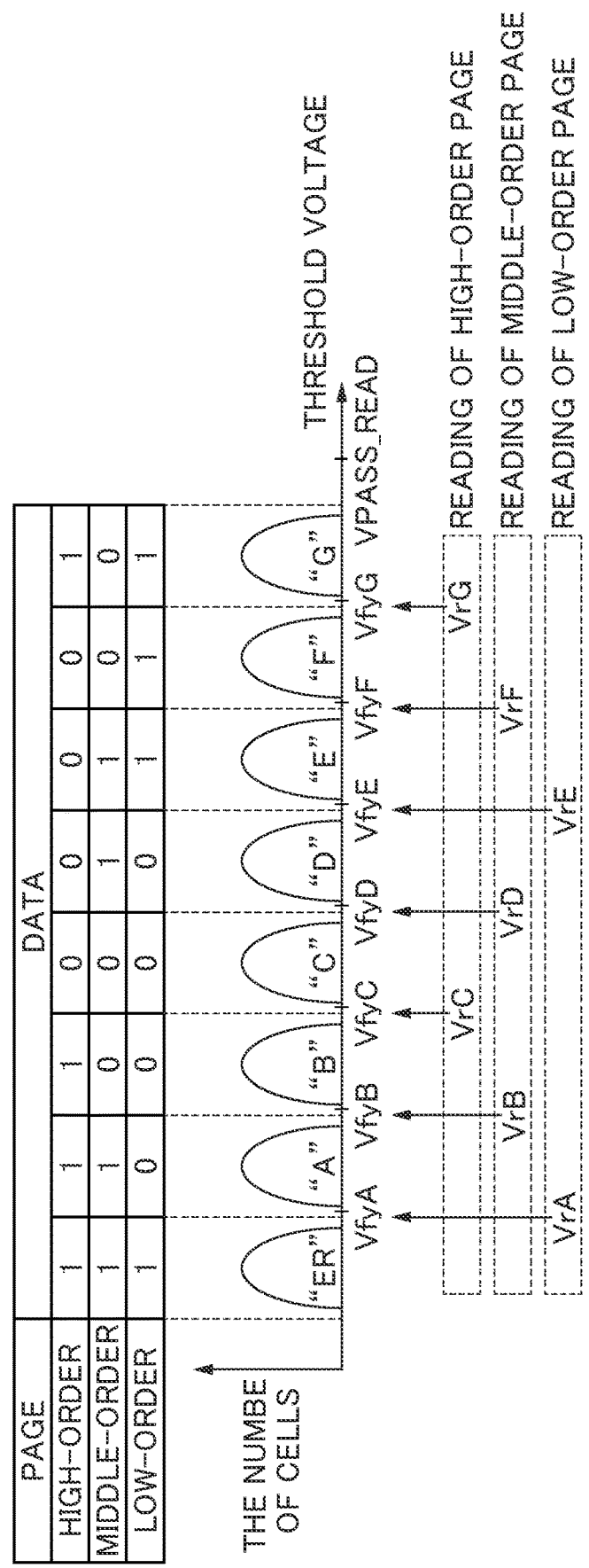
FIG. 7 is a chart illustrating an example of threshold distributions of memory cell transistors.

FIG. 7 is a chart schematically illustrating threshold distributions and the like of the memory cell transistors MT. The middle chart of FIG. 7 represents the correspondence between the threshold voltages of the memory cell transistors MT (abscissa axis) and the number of the memory cell transistors MT (ordinate axis).

When the TLC method is adopted as in the present embodiment, the plurality of memory cell transistors MT form eight threshold distributions as illustrated in the middle chart of FIG. 7. The eight threshold distributions (i.e., write levels) shall be referred to as an "ER" level, "A" level, "B" level, "C" level, "D" level, "E" level, "F" level, and "G" level, sequentially from the lowest threshold voltage.

A table in the upper chart of FIG. 7 represents an example of data allocated corresponding to each of the aforementioned threshold voltage levels. As illustrated in the table, different pieces of 3-bit data are allocated corresponding to the "ER" level, "A" level, "B" level, "C" level, "D" level, "E" level, "F" level, and "G" level as follows, for example.
   "ER" level: "111" ("low-order bit/middle-order bit/high-order bit")
   "A" level: "011"
   "B" level: "001"
   "C" level: "000"
   "D" level: "010"
   "E" level: "110"
   "F" level: "100"
   "G" level: "101"

As described above, the threshold voltage of each memory cell transistor MT in the present embodiment is at one of the eight candidate levels set in advance, and data is allocated corresponding to each of the candidate levels as described above.

A verify voltage used for a write operation is set between each pair of adjacent threshold distributions. Specifically, verify voltages VfyA, VfyB, VfyC, VfyD, VfyE, VfyF, and VfyG are respectively set corresponding to the "A" level, "B" level, "C" level, "D" level, "E" level, "F" level, and "G" level.

The verify voltage VfyA is set at a level between the highest threshold voltage of the "ER" level and the lowest threshold voltage of the "A" level. When the verify voltage VfyA is applied to a word line WL, among memory cell transistors MT connecting to the word line WL, memory cell transistors MT with a threshold voltage included in the "ER" level are turned ON, while memory cell transistors MT with a threshold voltage included in the threshold distribution of the "A" level or higher are turned OFF.

The other verify voltages VfyB, VfyC, VfyD, VfyE, VfyF, and VfyG are also set in a similar manner to the aforementioned verify voltage VfyA. The verify voltage VfyB is set at a level between the "A" level and the "B" level, the verify voltage VfyC is set at a level between the "B" level and the "C" level, the verify voltage VfyD is set at a level between the "C" level and the "D" level, the verify voltage VfyE is set at a level between the "D" level and the "E" level, the verify voltage VfyF is set at a level between the "E" level and the "F" level, and the verify voltage VfyG is set at a level between the "F" level and the "G" level.

For example, the verify voltage VfyA may be set to 0.8 V, the verify voltage VfyB may be set to 1.6 V, the verify voltage VfyC may be set to 2.4 V, the verify voltage VfyD may be set to 3.1 V, the verify voltage VfyE may be set to 3.8 V, the verify voltage VfyF may be set to 4.6 V, and the verify voltage VfyG may be set to 5.6 V. However, the verify voltages VfyA, VfyB, VfyC, VfyD, VfyE, VfyF, and VfyG are not limited to such values, and may be appropriately set in the range of 0 V to 7.0 V in stages, for example.

In addition, a read voltage used for a read operation is set between each pair of adjacent threshold distributions. The "read voltage" is a voltage applied to a word line WL connecting to a memory cell transistor MT as a read target, that is, a selected word line during a read operation. In the read operation, data is determined based on the result of determination of if the threshold voltage of the memory cell transistor MT as the read target is higher than the applied read voltage.

Specifically, as schematically illustrated in the lower chart of FIG. 7, a read voltage VrA for determining if the threshold voltage of the memory cell transistor MT is included in the "ER" level or included in the "A" level or higher is set at a level between the highest threshold voltage of the "ER" level and the lowest threshold voltage of the "A" level.

The other read voltages VrB, VrC, VrD, VrE, VrF, and VrG are also set in a similar manner to the aforementioned read voltage VrA. The read voltage VrB is set at a level between the "A" level and the "B" level, the read voltage VrC is set at a level between the "B" level and the "C" level, the read voltage VrD is set at a level between the "C" level and the "D" level, the read voltage VrE is set at a level between the "D" level and the "E" level, the read voltage VrF is set at a level between the "E" level and the "F" level, and the read voltage VrG is set at a level between the "F" level and the "G" level.

In addition, a read pass voltage VPASS_READ is set as a voltage higher than the highest threshold voltage of the highest threshold distribution (e.g., the "G" level). A memory cell transistor MT that has the read pass voltage VPASS_READ applied to its gate is turned ON regardless of the data stored therein.

It should be noted that the verify voltages VfyA, VfyB, VfyC, VfyD, VfyE, VfyF, and VfyG are respectively set higher than the read voltages VrA, VrB, VrC, VrD, VrE, VrF, and VrG, for example. That is, the verify voltages VfyA, VfyB, VfyC, VfyD, VfyE, VfyF, and VfyG are respectively set at levels around the lower limits of the threshold distributions of the "A" level, "B" level, "C" level, "D" level, "E" level, "F" level, and "G" level.

When the aforementioned data allocation is applied, 1 page data of the low-order bits (i.e., low-order page data) in a read operation can be determined based on the results of reading performed using the read voltages VrA and VrE. 1 page data of the middle-order bits (i.e., middle-order page data) can be determined based on the results of reading performed using the read voltages VrB, VrD, and VrF. 1 page data of the high-order bits (i.e., high-order page data) can be determined based on the results of reding performed using the read voltages VrC and VrG. In this manner, since the low-order page data, the middle-order page data, and the high-order page data are respectively determined through 2, 3, and 2 read operations, such data allocation is referred to as a "2-3-2 code."

It should be noted that the aforementioned data allocation is only exemplary, and the actual data allocation is not limited thereto. For example, 2-bit data or 4 or more-bit data may be stored in a single memory cell transistor MT. In addition, the number of threshold distributions (that is, the number of the aforementioned "candidate levels") to which data is allocated may be less than or equal to 7 or greater than or equal to 9. For example, it is also possible to use a "1-3-3 code" or a "1-2-4 code" instead of the "2-3-2 code." Further, the allocation of the low-order bit/the middle-order bit/the high-order bit may be changed, for example. More specifically, in the "2-3-2 code," for example, data may be allocated such that the low-order page data is determined based on the results of reading performed using the read voltages VrC and VrG, the middle-order page data is determined based on the results of reading performed using the read voltages VrB, VrD, and VrF, and the high-order page data is determined based on the results of reading performed using the read voltages VrA and VrE. That is, for example, the allocation of the low-order bits and the allocation of the high-order bits may be swapped with each other. In such a case, data is allocated as follows corresponding to each threshold voltage level.

"ER" level: "111" ("low-order bit/middle-order bit/high-order bit")
"A" level: "110"
"B" level: "100"
"C" level: "000"
"D" level: "010"
"E" level: "011"
"F" level: "001"
"G" level: "101"

A write operation performed on the semiconductor memory device 2 will be described. In the write operation, a program operation and a verify operation are performed. The "program operation" is the operation of injecting electrons into the charge storage layers 336 of some of the memory cell transistors MT to change the threshold voltages thereof. The "verify operation" is the operation of, after the program operation, reading data from the memory cell transistors MT to determine and verify if the threshold voltages of the memory cell transistors MT have reached a target level. Then, data writing to the memory cell transistors MT with the threshold voltages having reached the target level is prohibited. The "target level" herein is a specific candidate level set as a target level among the eight candidate levels described previously.

In the write operation, the aforementioned program operation and verify operation are repeatedly executed. Accordingly, the threshold voltages of the memory cell transistors MT are increased to the target level.

Among the plurality of word lines WL, a word line WL connecting to a memory cell transistor MT that is a target of the write operation (i.e., a target for changing the threshold voltage) shall be hereinafter also referred to as a "selected word line." Meanwhile, a word line WL connecting to a memory cell transistor MT that is not a target of the write operation shall be hereinafter also referred to as a "non-selected word line." A memory cell transistor MT that is a target of the write operation shall be hereinafter also referred to as a "selected memory transistor."

Among the plurality of string units SU, a string unit SU that is a target of the write operation shall be hereinafter also referred to as a "selected string unit." Meanwhile, a string unit SU that is not a target of the write operation shall be hereinafter also referred to as a "non-selected string unit."

The conductive pillar 338 of each NAND string NS included in the selected string unit, that is, each channel in the selected string unit shall be hereinafter also referred to as a "selected channel." Meanwhile, the conductive pillar 338 of each NAND string NS included in the non-selected string unit, that is, each channel in the non-selected string unit shall be hereinafter also referred to as a "non-selected channel."

Among the plurality of bit lines BL, a bit line BL connecting to the selected memory transistor shall be hereinafter also referred to as a "selected bit line." Meanwhile, a bit line BL not connecting to the selected memory transistor shall be hereinafter also referred to as a "non-selected bit line."

Figure 8:
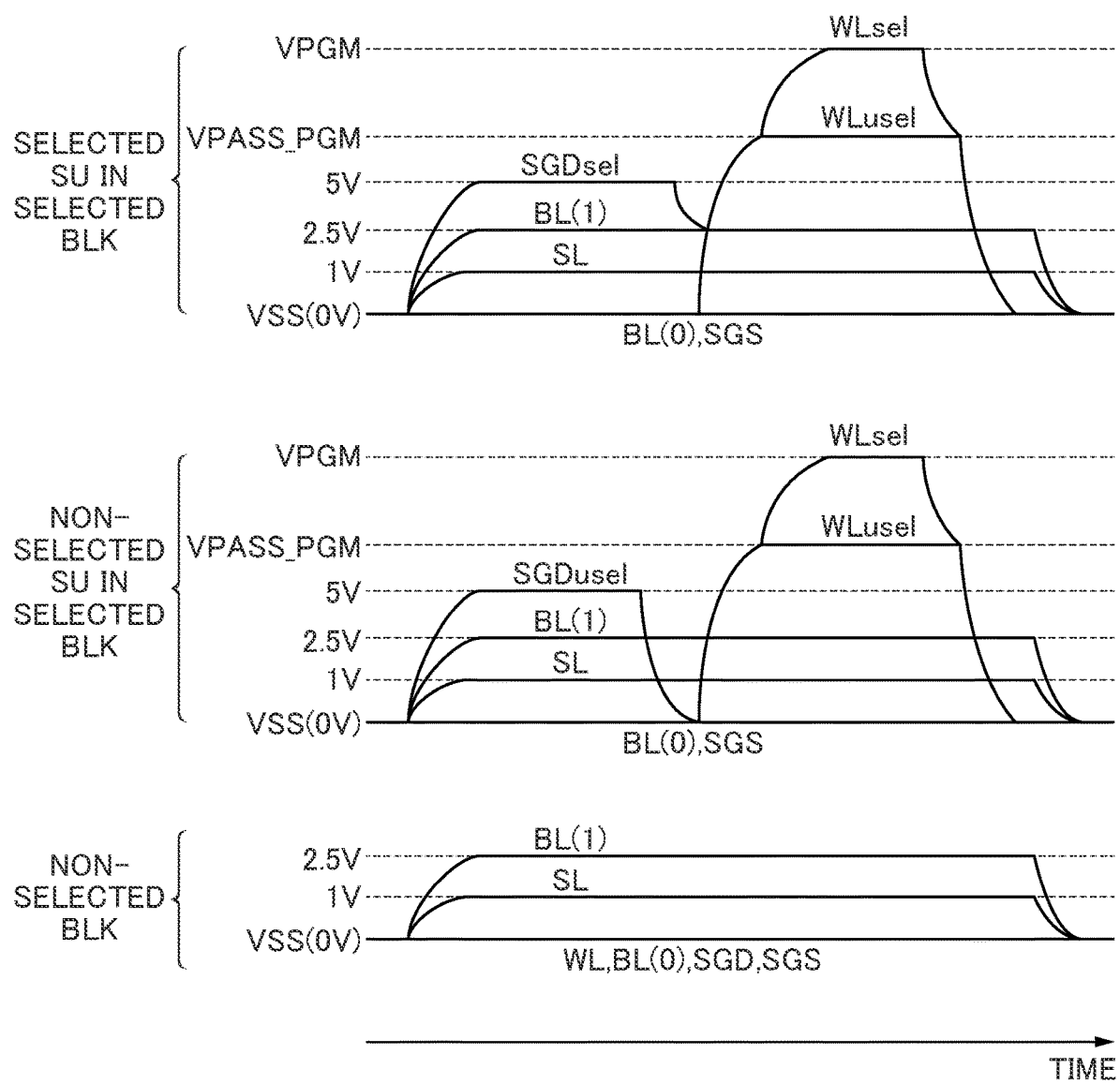
FIG. 8 is a chart illustrating changes in the potential of each wire during a write operation.

The program operation will be described. Although the following description illustrates an example in which the plane PL1 is a target of the program operation, the description also holds true for the plane PL2. FIG. 8 illustrates changes in the potential of each wire during the program operation. In the program operation, the sense amplifier 120 changes the potential of each bit line BL corresponding to program data. The ground voltage Vss (0 V), for example, is applied as the "L" level to a bit line BL connecting to a memory cell transistor MT that is a program target (i.e., whose threshold voltage should be increased). 2.5 V, for example, is applied as the "H" level to a bit line BL connecting to a memory cell transistor MT that is not a program target (i.e., whose threshold voltage should be maintained). The former bit line BL is expressed as "BL(0)" in FIG. 8. The latter bit line BL is expressed as "BL(1)" in FIG. 8.

The row decoder 130 selects one of the blocks BLK as a target of the write operation, and further selects one of the string units SU. More specifically, 5 V, for example, is applied to the selection gate line SGD in the selected string unit SU (i.e., the selected selection gate line SGDsel) by the voltage generation circuit 43 via the row decoder 130. Accordingly, the selection transistors ST1 are turned ON. Meanwhile, the voltage Vss, for example, is applied to the selection gate line SGS from the voltage generation circuit 43 via the row decoder 130. Accordingly, the selection transistors ST2 are turned OFF.

A voltage of 5 V, for example, is applied to the selection gate line SGD in the non-selected string unit SU within the selected block BLK (i.e., the non-selected selection gate line SGDusel) by the voltage generation circuit 43 via the row decoder 130. Accordingly, the selection transistors ST1 are turned ON. It should be noted that the selection gate line SGS is connected in common to the string units SU included in each block BLK. Thus, the selection transistors ST2 are also turned OFF in the non-selected string unit SU.

Further, the voltage Vss, for example, is applied to the selection gate lines SGD and the selection gate line SGS in the non-selected block BLK by the voltage generation circuit 43 via the row decoder 130. Accordingly, the selection transistors ST1 and ST2 are turned OFF.

The source line SL is set at a potential higher than that of the selection gate line SGS. For example, the potential is 1 V.

After that, the potential of the selected selection gate line SGDsel in the selected block BLK is set to 2.5 V, for example. This potential is a voltage for turning ON the selection transistor ST1 corresponding to the bit line BL(0) provided with 0 V and for cutting OFF the selection transistor ST1 corresponding to the bit line BL(1) provided with 2.5 V in the aforementioned example. Accordingly, in the selected string unit SU, the selection transistor ST1 corresponding to the bit line BL(0) is turned ON, and the selection transistor ST1 corresponding to the bit line BL(1) provided with 2.5 V is cut OFF. Meanwhile, the potential of the non-selected selection gate line SGDusel is set to the voltage Vss, for example. Accordingly, in the non-selected string unit SU, the selection transistors ST1 are cut OFF regardless of the potentials of the bit line BL(0) and the bit line BL(1).

The row decoder 130 selects one of the word lines WL as a target of the write operation in the selected block BLK. The voltage VPGM, for example, is applied to the word line WL that is the target of the write operation (i.e., the selected word line WLsel) by the voltage generation circuit 43 via the row decoder 130. Meanwhile, the voltage VPASS_PGM, for example, is applied to the other word lines WL (i.e., the non-selected word lines WLusel) by the voltage generation circuit 43 via the row decoder 130. The voltage VPGM is a high voltage for injecting electrons into the charge storage layers 336 through the tunneling phenomenon. The voltage VPASS_PGM is a voltage at about a level that turns ON the memory cell transistors MT connecting to the word lines WL but does not change the threshold voltages thereof. VPGM is a voltage higher than VPASS_PGM.

In the NAND string NS corresponding to the bit line BL(0) that is a program target, the selection transistor ST1 is turned ON. Therefore, the channel potential of the memory cell transistor MT connected to the selected word line WLsel becomes 0 V. The potential difference between the control gate and the channel is increased, and consequently, electrons are injected into the charge storage layer 336, which in turn increases the threshold voltage of the memory cell transistor MT.

In the NAND string NS corresponding to the bit line BL(1) that is not a program target, the selection transistor ST1 is cut OFF. Therefore, the channel of the memory cell transistor MT connected to the selected word line WLsel is electrically floated, and thus, the channel potential is increased to around the voltage VPGM due to capacitive coupling with the word line WL and the like. The potential difference between the control gate and the channel decreases, and consequently, electrons are not injected into the charge storage layer 336. Thus, the threshold voltage of the memory cell transistor MT is maintained. To be exact, the threshold voltage does not change to such a degree that the threshold distribution level transitions to a higher distribution level.

Figure 9:
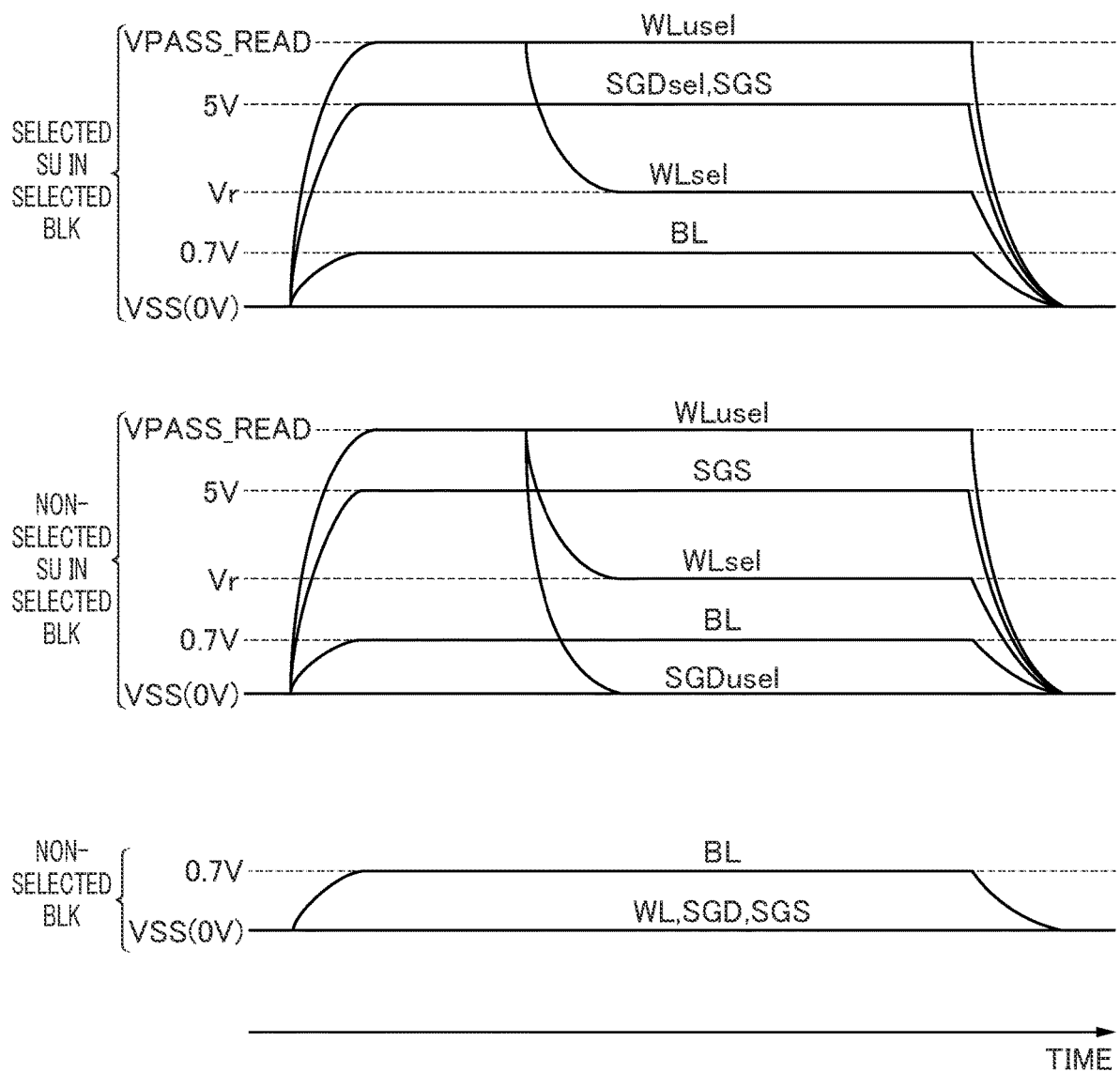
FIG. 9 is a chart illustrating changes in the potential of each wire during a read operation.

A read operation will be described. Although the following description illustrates an example in which the plane PL1 is a target of the read operation, the description also holds true for the plane PL2. The verify operation performed following the program operation is the same as the read operation described below. FIG. 9 illustrates changes in the potential of each wire during the read operation. In the read operation, a NAND string NS including a memory cell transistor MT that is a target of the read operation is selected. Alternatively, a string unit SU including a page that is a target of the read operation is selected.

First, 5 V, for example, is applied to the selected selection gate line SGDsel, the non-selected selection gate lines SGDusel, and the selection gate line SGS by the voltage generation circuit 43 via the row decoder 130. Accordingly, the selection transistors ST1 and ST2 included in the selected block BLK are turned ON. In addition, the read pass voltage VPASS_READ, for example, is applied to the selected word line WLsel and the non-selected word lines by the voltage generation circuit 43 via the row decoder 130. The read pass voltage VPASS_READ is a voltage at about a level that can turn ON the memory cell transistors MT but does not change the threshold voltages thereof regardless of the threshold voltages. Accordingly, current is supplied to all NAND strings NS included in the selected block BLK regardless of whether they are in the selected string unit SU or the non-selected string unit SU.

Next, the read voltage Vr like VrA, for example, is applied to the word line WL connecting to the memory cell transistor MT that is the target of the read operation (i.e., the selected word line WLsel) by the voltage generation circuit 43 via the row decoder 130. Meanwhile, the read pass voltage VPASS_READ is applied to the other word lines (i.e., the non-selected word lines WLusel).

The voltages applied to the selected selection gate line SGDsel and the selection gate line SGS are maintained, while the voltage Vss, for example, is applied to the non-selected selection gate line SGDusel by the voltage generation circuit 43 via the row decoder 130. Accordingly, the selection transistors ST1 included in the selected string unit SU are maintained ON, while the selection transistors ST1 included in the non-selected string unit SU are turned OFF. It should be noted that the selection transistors ST2 included in the selected block BLK are turned ON regardless of whether they are in the selected string unit SU or the non-selected string unit SU.

Accordingly, in each NAND string NS included in the non-selected string unit SU, at least the selection transistor ST1 is turned OFF, and thus, a current path is not formed therein. Meanwhile, in each NAND strings NS included in the selected string unit SU, a current path is formed or is not formed depending on the relationship between the read voltage Vr applied to the selected word line WLsel and the threshold voltage of the memory cell transistor MT.

The sense amplifier 120 applies a voltage to the bit line BL connecting to the selected NAND string NS. In such a state, the sense amplifier 120 performs data reading based on the value of current flowing through the bit line BL. Specifically, the sense amplifier 120 determines if the threshold voltage of the memory cell transistor MT that is the target of the read operation is higher than the read voltage applied to the memory cell transistor MT. It should be noted that data reading may be performed not based on the value of current flowing through the bit line BL but based on temporal changes in the potential of the bit line BL. In the latter case, the bit line BL is pre-charged to be at a predetermined potential in advance.

The verify operation described previously is also performed in a similar manner to the aforementioned read operation. In the verify operation, a verify voltage like VfyA, for example, is applied to a word line WL connecting to a memory cell transistor MT that is a verify target by the voltage generation circuit 43 via the row decoder 130.

It should be noted that the operation of applying a voltage of 5 V to the selected selection gate line SGDsel and the non-selected selection gate line SGDusel in the initial stage of the program operation described previously may be omitted. Similarly, the operation of applying a voltage of 5 V to the non-selected selection gate line SGDusel and applying the read pass voltage VPASS_READ to the selected word line WLsel in the initial stage of the read operation (or verify operation) described previously may be omitted.

A specific flow of signals transferred between the semiconductor memory device 2 and the memory controller 1 in the read operation, for example, will be described. Although the following description illustrates an example in which the plane PL1 is a target of the read operation, the description also holds true for the plane PL2.

FIG. 10 illustrates examples of various signals and the like transferred between the semiconductor memory device 2 and the memory controller 1 in the configuration according to the present embodiment.

In the read operation, the memory controller 1 sequentially inputs to the semiconductor memory device 2 a signal containing "05h," a plurality of "ADDs," and "E0h" as the signal DQ<7:0>. "05h" is a command for executing an operation of reading data from the memory cell array 110. "ADD" is a signal designating the address of a data read source. "E0h" is a command for staring the read operation.

FIG. 10 illustrates the timing at which "E0h" is input to the semiconductor memory device 2 as a time to. At a time t1 when a predetermined duration has elapsed from the time t0, the memory controller 1 initiates a toggle of each of the read enable signals /RE and RE. As described previously, each of the read enable signals /RE and RE is a signal for reading data from the semiconductor memory device 2 by the memory controller 1, and is input to the input/output pads 31 of the semiconductor memory device 2. After the time t1, the read enable signal /RE is alternately switched between the H level and the L level.

The read enable signal RE input to the semiconductor memory device 2 from the external memory controller 1 corresponds to a "first toggle signal" in the present embodiment. The other read enable signal /RE corresponds to a "reference signal" in the present embodiment. It should be noted that such a definition has been determined only for convenience's sake, and thus, the read enable signal /RE may be regarded as corresponding to the "first toggle signal" and the read enable signal RE may be regarded as corresponding to the "reference signal." The logic control circuit 22 described previously has a function of receiving each of the read enable signals /RE and RE. Thus, the logic control circuit 22 corresponds to a "receiving unit" in the present embodiment.

The semiconductor memory device 2 outputs new data as the signal DQ<7:0> each time the read enable signals /RE and RE are switched between the H level and the L level, and also switches the data strobe signal DQS between the H level and the L level. In this manner, the semiconductor memory device 2 outputs data at a high speed corresponding to each of the rise and fall of the data strobe signal DQS, and is also referred to as "DDR SDRAMs (Double data rate synchronous DRAMs)."

In FIG. 10, each piece of data output as the signal DQ<7:0> is indicated by "D." The timing at which the first data is output and the data strobe signal DQS is switched is indicated by a time t2. The correspondence between the switching of the read enable signal /RE received from the memory controller 1 and switching of the data strobe signal DQS output from the semiconductor memory device 2 is indicated by dotted arrows in FIG. 10.

As described below, the data strobe signal DQS is a signal generated in the semiconductor memory device 2 based on the read enable signals /RE and RE received from the memory controller 1, and is a signal switched in about the same cycles as the read enable signals /RE and RE.

It should be noted that data read from the semiconductor memory device 2 is output by splitting a single piece of data into pieces of even data including even-numbered bits and pieces of odd data including odd-numbered bits, and alternately outputting them. Each piece of data indicated by "D" in FIG. 10 is output as either the even data or the odd data.

After acquiring a single piece of read data, the memory controller 1 acquires the next read data at the timing after the data strobe signal DQS is switched. For example, the memory controller 1 acquires the read data at each timing in the middle of each timing when the data strobe signal DQS is alternately switched. In this manner, the memory controller 1 can acquire the read data at each timing synchronous with the switching of the data strobe signal DQS.

To achieve such acquisition of the read data, it is preferable that the proportion between the length of a period when the data strobe signal DQS is at the H level and that when it is at the L level, that is, the duty cycle be a preset constant proportion (e.g., 50%).

Figure 11A:
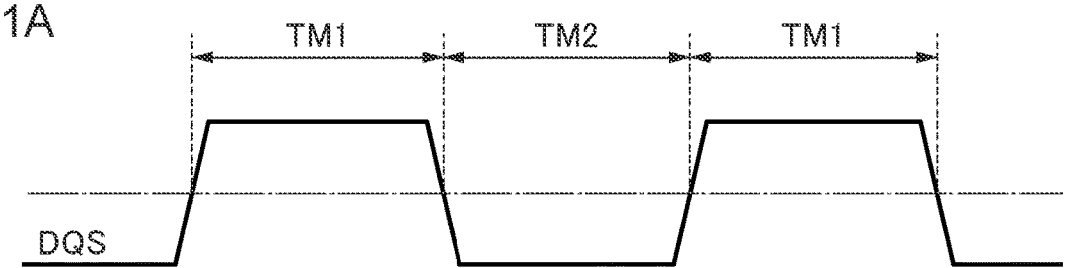
FIGS. 11A and 11B are charts for illustrating the duty cycle of a toggle signal.

FIG. 11A illustrates an example of the data strobe signal DQS alternately switched between the H level and the L level. The dashed and single-dotted line in FIG. 11A indicates a level intermediate between the H level and the L level. In FIG. 11A, a period when the data strobe signal DQS is above the intermediate level is indicated by "TM1" and a period when the data strobe signal DQS is below the intermediate level is indicated by "TM2." In the example of FIG. 11A, the lengths of TM1 and TM2 are equal, and thus, the duty cycle is 50%. It should be noted that the target value of the duty cycle may be 50% as in the example of FIG. 11A, but may also be a predetermined value different from 50%.

It should be noted that the definition of the duty cycle may be different from that described above. For example, a period from when the data strobe signal DQS has started to rise to when it has started to fall may be defined as TM1, and a period from when the data strobe signal DQS has started to fall to when it has started to rise again may be defined as TM2, and the proportion between such periods may be defined as the duty cycle.

The data strobe signal DQS is generated based on the read enable signals /RE and RE from the memory controller 1 as described previously. Therefore, when the target value of the duty cycle of the data strobe signal DQS is 50%, the duty cycle of the read enable signal /RE or the like as a source signal is also preferably 50%.

However, even when the duty cycle of the read enable signal /RE or the like is 50% at the timing when it is transmitted from the memory controller 1, the duty cycle may change from the original value until the signal reaches the semiconductor memory device 2. In such a case, the duty cycle of the generated data strobe signal DQS also becomes a value different from 50%.

Figure 11B:
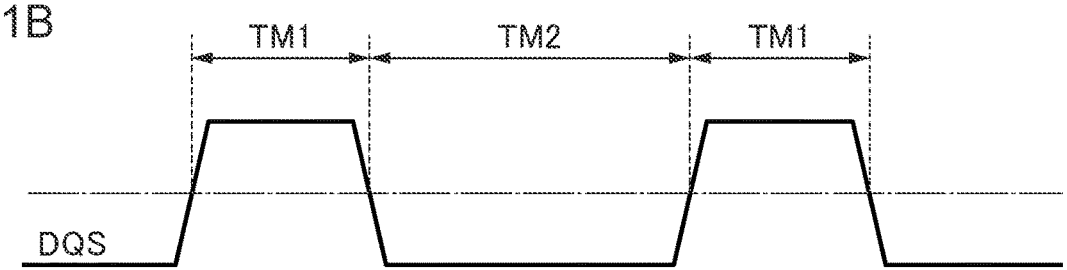

In addition, the duty cycle may further change while the data strobe signal DQS is generated in the semiconductor memory device 2 or until the signal is output from the logic control pads 32. FIG. 11B illustrates an example in which the duty cycle of the data strobe signal DQS has become less than 50%, that is, an example in which TM1 has become shorter than TM2 due to various factors such as those described above.

In response, the semiconductor memory device 2 according to the present embodiment includes a circuit for internally correcting the duty cycle of the data strobe signal DQS to make it closer to the target value (e.g., 50%).

Figure 12:
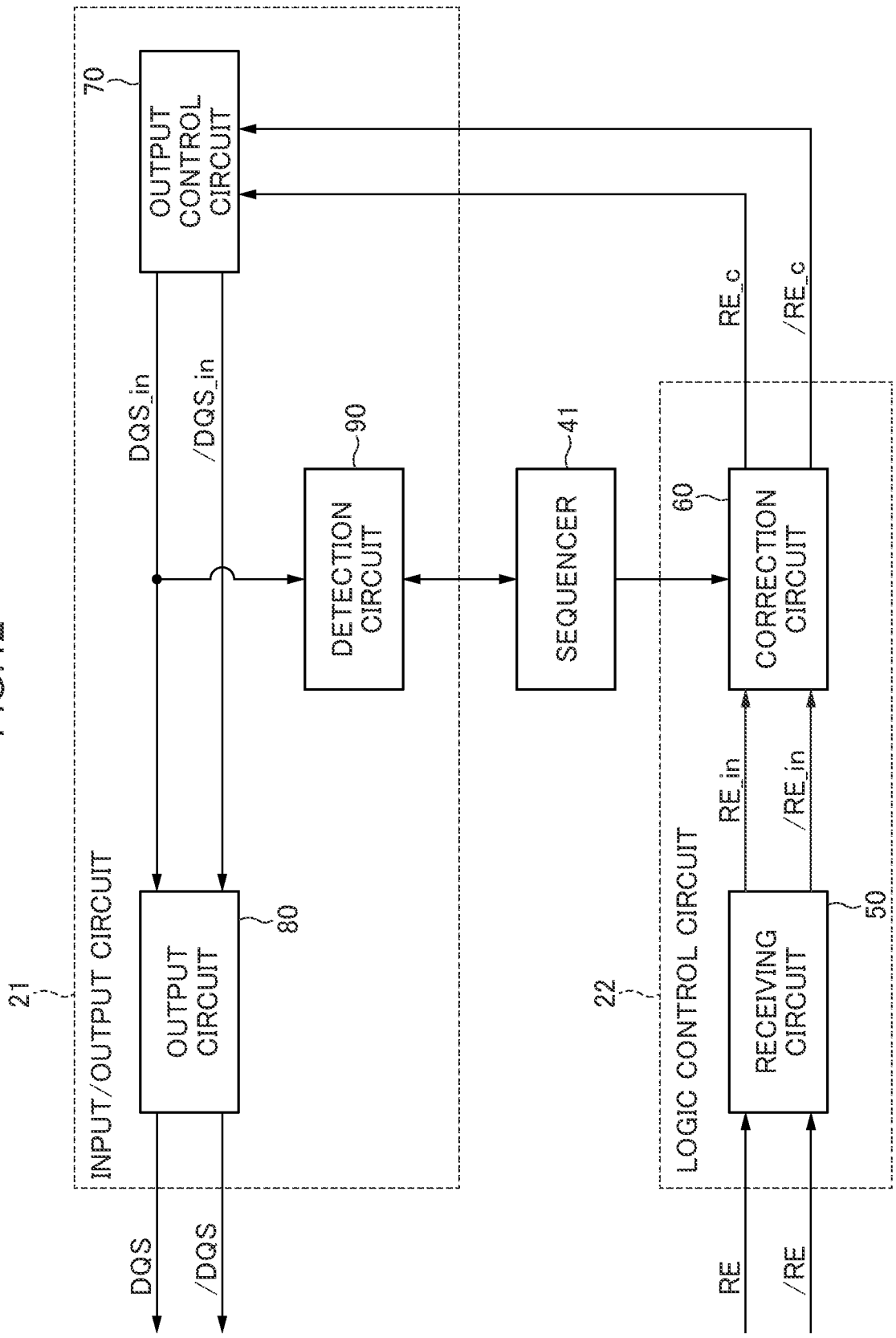
FIG. 12 is a diagram schematically illustrating a part of the configuration of the semiconductor memory device according to the first embodiment.

FIG. 12 schematically illustrates a part of the configuration of the semiconductor memory device 2 illustrated in FIG. 3. As illustrated in FIG. 12, the logic control circuit 22 includes a receiving circuit 50 and a correction circuit 60.

The receiving circuit 50 is a portion that receives the read enable signals /RE and RE and then generates signals /RE_in and RE_in based thereon and outputs the generated signals. The signal /RE_in is a signal that is at the H level when the read enable signal /RE is at a level higher than the read enable signal RE, and is at the L level in other cases. The signal RE_in is a signal complementary to the signal /RE_in. The signals /RE_in and RE_in can be considered as signals switched in synchronism with the read enable signals /RE and RE (i.e., the first toggle signal), respectively, and correspond to a "second toggle signal" in the present embodiment. Of the two signals, the signal RE_in also corresponds to a "third toggle signal" in the present embodiment, and the signal /RE_in also corresponds to a "fourth toggle signal" in the present embodiment. A specific configuration of the receiving circuit 50 for generating the signals RE_in and /RE_in will be described below.

The correction circuit 60 is a portion that corrects the duty cycles of the signals /RE_in and RE_in, and outputs the resulting signals /RE_c and RE_c with the corrected duty cycles to an output control circuit 70 described below. That is, the correction circuit 60 is a portion that adjusts the duty cycles of the signals /RE_in and RE_in as the second toggle signal, and corresponds to an "adjustment unit" in the present embodiment. A specific configuration and correction method of the correction circuit 60 will be described below.

As illustrated in FIG. 12, the input/output circuit 21 includes the output control circuit 70, the output circuit 80, and a detection circuit 90.

The output control circuit 70 is a portion that generates signals /DQS_in and DQS_in based on the signals /RE_c and RE_c, respectively. The signal /DQS_in is a toggle signal switched in synchronism with the signal /RE_c. The signal DQS_in is a signal complementary to the signal /DQS_in, and is a toggle signal switched in synchronism with the signal RE_c. The signal /DQS_in may be the same signal as the signal /RE_c, and the signal DQS_in may be the same signal as the signal RE_c. The duty cycles of the signals /DQS_in and DQS_in are roughly equal to the duty cycles (that is, the corrected duty cycles) of the signals /RE_c and RE_c, respectively.

The output circuit 80 is a portion that generates the data strobe signals /DQS and DQS based on the signals /DQS_in and DQS_in, respectively. The data strobe signal /DQS is a toggle signal switched in synchronism with the signal /DQS_in. The data strobe signal DQS is a signal complementary to the data strobe signal /DQS, and is a toggle signal switched in synchronism with the signal DQS_in. The data strobe signal /DQS may be the same signal as the signal /DQS_in, and the data strobe signal DQS may be the same signal as the signal DQS_in. The duty cycles of the data strobe signals /DQS and DQS are roughly equal to the duty cycles (that is, the corrected duty cycles) of the signals /DQS_in and DQS_in, respectively.

Each of the data strobe signals /DQS and DQS can be considered as a signal generated based on the second toggle signal with the duty cycle adjusted by the correction circuit 60. Alternatively, each of the data strobe signals /DQS and DQS may be the second toggle signal with the duty cycle adjusted by the correction circuit 60. The input/output circuit 21 described previously has a function of transmitting such data strobe signals /DQS and DQS to the outside, and thus corresponds to a "transmitting unit" in the present embodiment.

As described above, the read enable signals /RE and RE input to the semiconductor memory device 2 sequentially pass through the receiving circuit 50, the correction circuit 60, the output control circuit 70, and the output circuit 80, and are finally output to the memory controller 1 as the data strobe signals /DQS and DQS. While the signals pass through such circuits, the duty cycles of the signals are corrected by the correction circuit 60.

The detection circuit 90 is a circuit configured to generate a signal corresponding to the duty cycle of the input signal DQS_in, and output the generated signal to the sequencer 41. The "signal corresponding to the duty cycle of the signal DQS_in" may be a binary signal indicating whether the duty cycle of the signal DQS_in is greater than a target value, or may be a signal obtained by quantifying the duty cycle of the signal DQS_in based on a predetermined resolution. It should be noted that the signal input to the detection circuit 90 may be not the signal DQS_in but the signal /DQS_in. As the configuration of such detection circuit 90, various known configurations can be adopted. Thus, specific illustration and description thereof are omitted herein.

The sequencer 41 receives from the detection circuit 90 the signal corresponding to the duty cycle of the signal DQS_in, and then generates a signal needed to correct the duty cycle and outputs the generated signal to the correction circuit 60. Such a signal shall be hereinafter also referred to as a "correction code." The correction circuit 60 corrects the duty cycle of each of the signals /RE_in and RE_in based on the correction code received from the sequencer 41.

In this manner, in the semiconductor memory device 2, the duty cycle of the signal /RE_in or the like is corrected by generating a correction code based on the duty cycle of the signal DQS_in at a position close to the output side along the transmission paths of the source signals of the data strobe signals /DQS and DQS, and feeding back the correction code. Accordingly, the duty cycles of the data strobe signals /DQS and DQS can be made closer to a predetermined target value.

Figure 13:
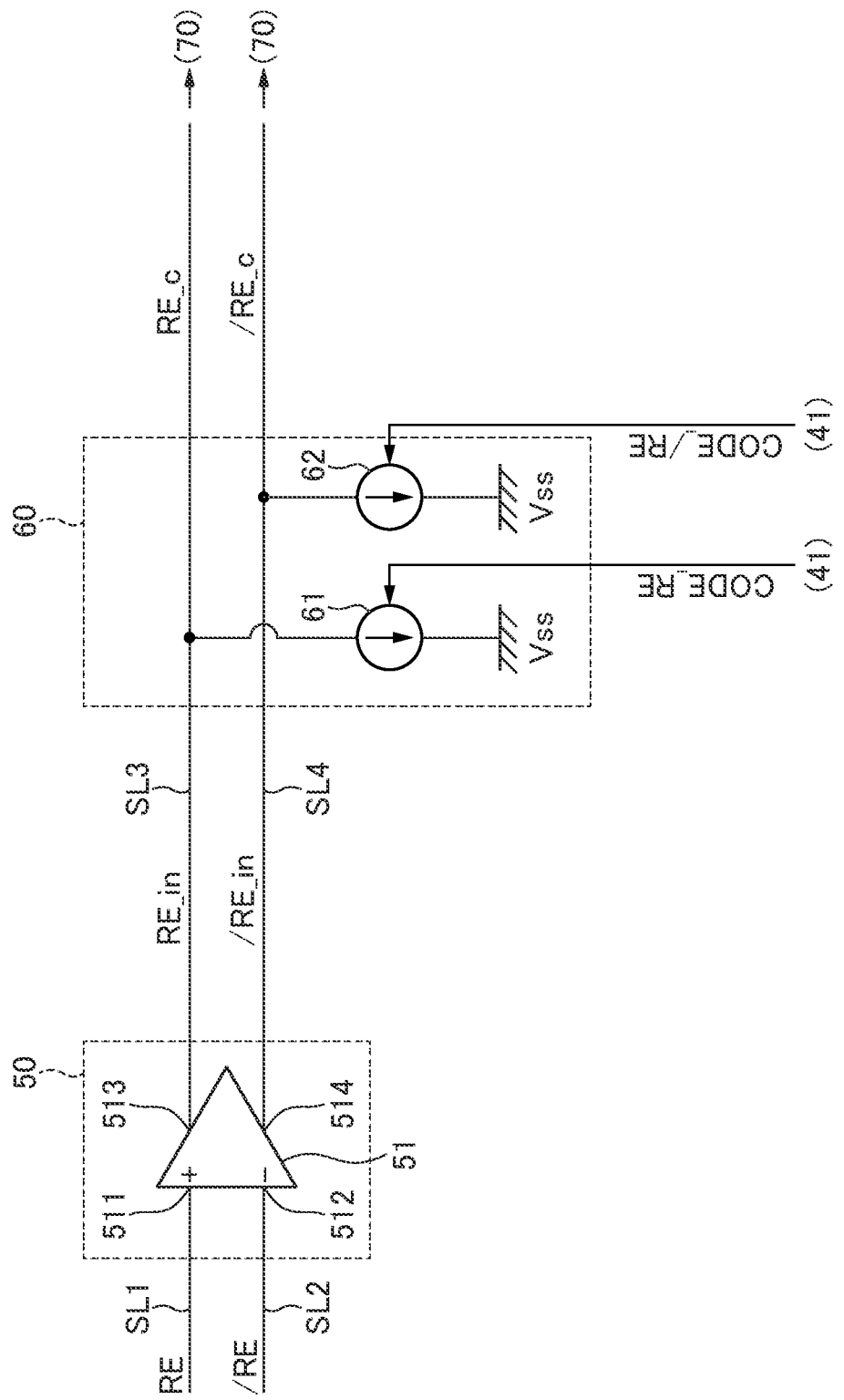
FIG. 13 is a diagram illustrating the configurations of a receiving circuit and a correction circuit in the semiconductor memory device according to the first embodiment.

A specific configuration of the receiving circuit 50 will be described with reference to FIG. 13. As illustrated in FIG. 13, the receiving circuit 50 includes a comparator 51. The comparator 51 includes a first input portion 511, a second input portion 512, a first output portion 513, and a second output portion 514.

The first input portion 511 is a portion that receives the read enable signal RE as the first toggle signal. The first input portion 511 connects to a signal line SL1 for transmitting the read enable signal RE from the input/output pads 31.

The second input portion 512 is a portion that receives the read enable signal /RE as the reference signal. The second input portion 512 connects to a signal line SL2 for transmitting the read enable signal /RE from the input/output pads 31.

The first output portion 513 is a portion that outputs the signal RE_in as the third toggle signal. The first output portion 513 connects to a signal line SL3 for transmitting the signal RE_in to the output control circuit 70.

The second output portion 514 is a portion that outputs the signal /RE_in as the fourth toggle signal. The second output portion 514 connects to a signal line SL4 for transmitting the signal /RE_in to the output control circuit 70.

When the read enable signal RE (i.e., the first toggle signal) input to the comparator 51 is at a level higher than the read enable signal /RE (i.e., the reference signal), the comparator 51 outputs the signal /RE_in (i.e., the fourth toggle signal) at the H level from the second output portion 514, and also outputs the signal RE_in (i.e., the third toggle signal) at the L level from the first output portion 513. In other cases, the comparator 51 outputs the signal /RE_in (i.e., the fourth toggle signal) at the L level from the second output portion 514, and also outputs the signal RE_in (i.e., the third toggle signal) at the H level from the first output portion 513. As a specific configuration of the comparator 51 that operates in this manner, a known configuration can be adopted. Thus, specific illustration and description thereof are omitted herein.

The signal RE_in (i.e., the third toggle signal) and the signal /RE_in (i.e., the fourth toggle signal) can be considered as signals that are switched according to the magnitude relationship between the first toggle signal and the reference signal. The comparator 51 with such a configuration corresponds to a "first comparator" in the present embodiment.

Still referring to FIG. 13, a specific configuration of the correction circuit 60 will be described. As illustrated in FIG. 13, the correction circuit 60 includes current sources 61 and 62.

The current source 61 is a variable current source electrically connected to the first output portion 513. Specifically, the current source 61 is connected between the signal line SL3 and the ground line Vss, and is configured to be able to adjust the amount of current flowing toward the ground line Vss. The amount of current output from the current source 61, that is, the amount of current drawn from the signal line SL3 by the current source 61 is adjusted based on a correction code (CODE_RE) transmitted from the sequencer 41.

The correction code is a 3-bit digital signal like the one illustrated in each row of FIG. 14, for example. The sequencer 41 adjusts the amount of current drawn from the signal line SL3 by the current source 61 by transmitting a correction code illustrated in one of the rows a to h of FIG. 14 to the current source 61. In the example illustrated in FIG. 14, the amount of current is the smallest when the correction code in the row a is transmitted, and is the largest when the correction code in the row h is transmitted.

In the current source 61 according to the present embodiment, three current sources (not illustrated) with different current values are connected in parallel, and are configured such that the respective current sources are individually switched ON/OFF according to the values of the high-order bit, the middle-order bit, and the low-order bit of the correction code. For example, when the correction code in the row g is transmitted, the current sources corresponding to the high-order bit and the middle-order bit are switched ON, while the current source corresponding to the low-order bit is switched OFF. According to such a method, the amount of current drawn from the signal line SL3 by the current source 61 can be adjusted in a stepwise manner corresponding to the correction code in each row of FIG. 14.

The current source 62 is a variable current source electrically connected to the second output portion 514. Specifically, the current source 62 is connected between the signal line SL4 and the ground line Vss, and is configured to be able to adjust the amount of current flowing toward the ground line Vss. The amount of current output from the current source 62, that is, the amount of current drawn from the signal line SL4 by the current source 62 is adjusted based on a correction code (CODE_/RE) transmitted from the sequencer 41. The correction code is similar to the correction code (CODE_RE) illustrated in FIG. 14, but is transmitted from the sequencer 41 as a signal independent of the correction code transmitted to the current source 61. The configuration of the current source 62 is the same as that of the current source 61.

The sequencer 41 can individually adjust the amount of current drawn from the signal line SL3 by the current source 61 and the amount of current drawn from the signal line SL4 by the current source 62. At this time, the sequencer 41 can change the duty cycles of the signals /RE_c and RE_c by setting the amounts of current drawn by the respective current sources 61 and 62 to be different from each other.

Figure 15:
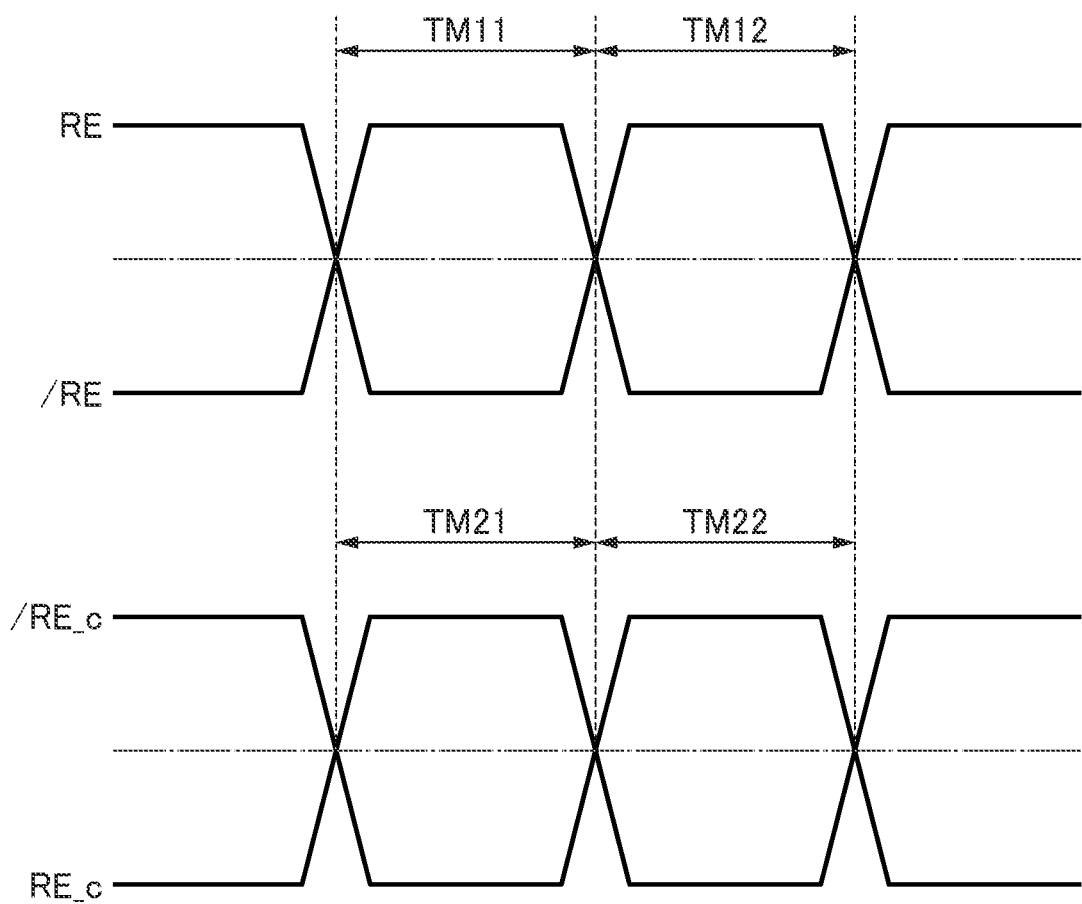
FIG. 15 is a chart illustrating an example of a toggle signal.

The reason therefor will be described. The upper chart of FIG. 15 illustrates an example of temporal changes in the read enable signals /RE and RE. The lower chart of FIG. 15 illustrates an example of temporal changes in the signals /RE_c and RE_c respectively generated by correcting the signals /RE_in and RE_in, which have been generated based on the read enable signals /RE and RE, with the correction circuit 60.

In FIG. 15, a period when the read enable signal /RE is at a level above the intermediate level is indicated by "TM11," and a period when the read enable signal /RE is at a level below the intermediate level is indicated by "TM12." In addition, a period when the signal RE_c is at a level above the intermediate level is indicated by "TM21," and a period when the signal RE_c is at a level below the intermediate level is indicated by "TM22."

In the example of FIG. 15, each of the duty cycles of the read enable signals /RE and RE received from the memory controller 1 is 50% equal to the target value. Thus, the lengths of TM11 and TM12 are equal. Provided that there is no disturbance of the signals resulting from circuits including the comparator 51, the duty cycle of each of the output signals /RE_c and RE_c is also 50% equal to the target value. Specifically, the length of TM21 is roughly equal to the length of TM11, and the length of TM22 is roughly equal to the length of TM12. Consequently, the lengths of TM21 and TM22 are equal.

In the example of FIG. 15, the sequencer 41 transmits the same correction code (e.g., the correction code illustrated in the row d of FIG. 14) to the current sources 61 and 62. The amount of current drawn by the current source 61 and the amount of current drawn by the current source 62 are equal, and no correction is applied by the correction circuit 60. Consequently, the lengths of TM21 and TM22 remain equal.

Figure 16:
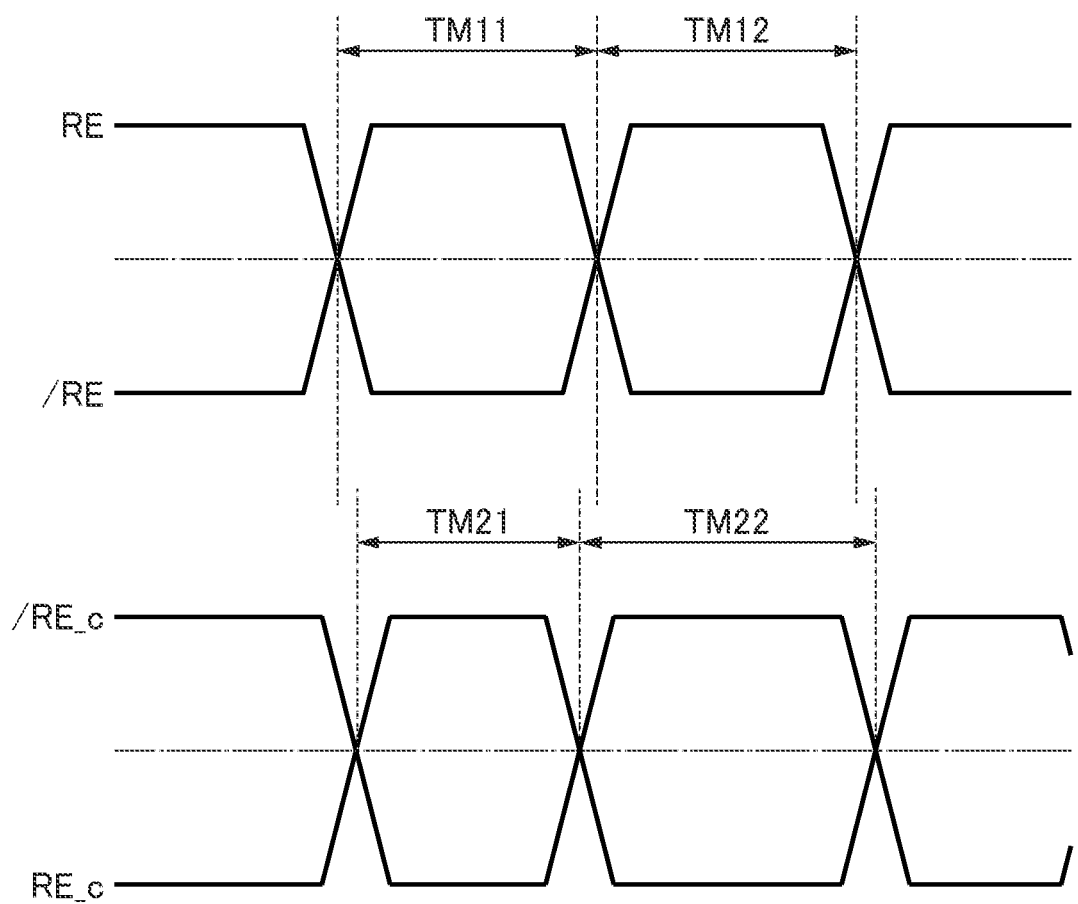
FIG. 16 is a chart illustrating an example of a toggle signal.

FIG. 16 illustrates another example of temporal changes in the read enable signal /RE and the like, with a method similar to that in FIG. 15. In this example also, the duty cycle of each of the read enable signals /RE and RE received from the memory controller 1 is 50% equal to the target value as in FIG. 15, and the lengths of TM11 and TM12 are equal.

In the example of FIG. 16, the sequencer 41 transmits different correction codes to the current sources 61 and 62. Specifically, the sequencer 41 transmits a correction code illustrated in the row e of FIG. 14 to the current source 61, and transmits a correction code illustrated in the row c of FIG. 14 to the current source 62. That is, the amount of current drawn by the current source 61 is increased than that in FIG. 15, while the amount of current drawn by the current source 62 is reduced than that in FIG. 15.

In such a case, as illustrated in FIG. 16, TM21 becomes shorter than TM11, and TM22 becomes longer than TM12. Consequently, since TM21 becomes shorter than TM22, the duty cycle of the signal RE_c becomes less than 50%, and thus, the duty cycle of the data strobe signal DQS generated based on such a signal also becomes less than 50%.

Figure 17:
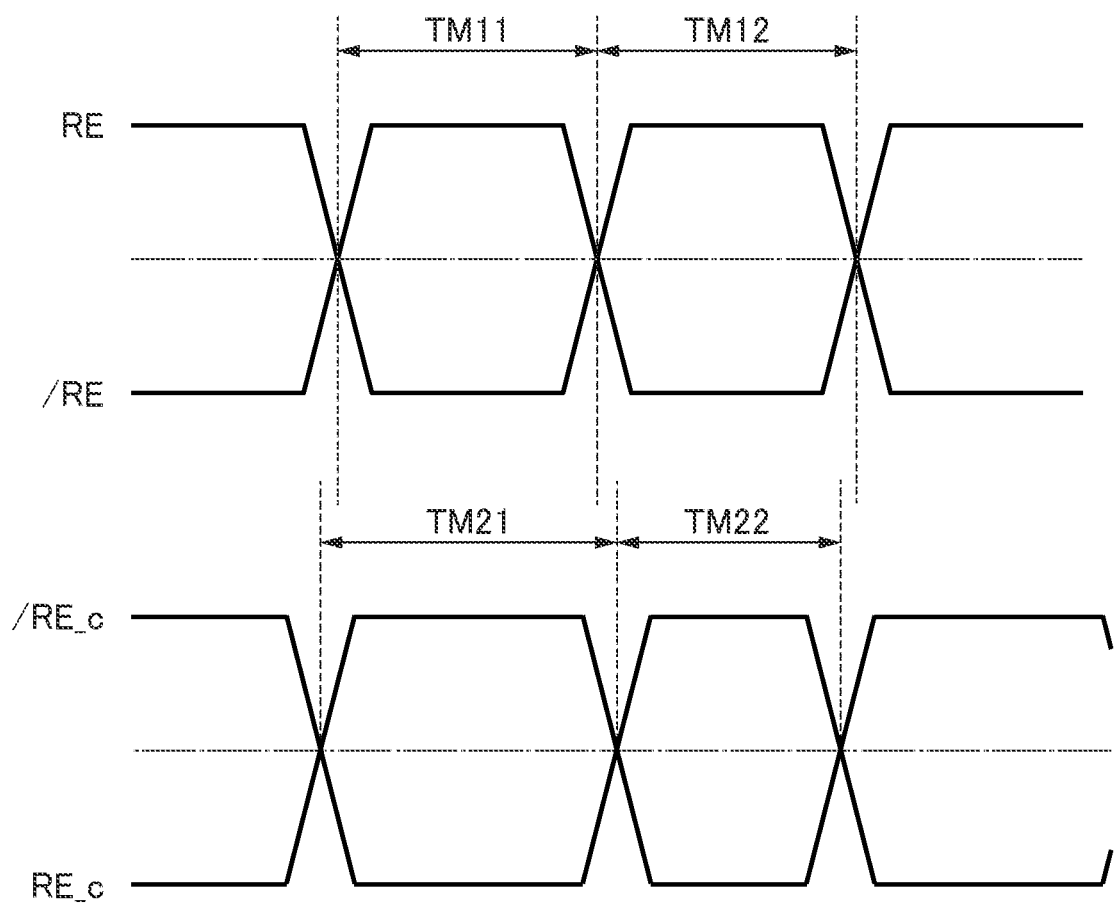
FIG. 17 is a chart illustrating an example of a toggle signal.

FIG. 17 illustrates further another example of temporal changes in the read enable signal /RE and the like, with a method similar to those in FIGS. 15 and 16. In this example also, the duty cycle of each of the read enable signals /RE and RE received from the memory controller 1 is 50% equal to the target value as in FIG. 15, and the lengths of TM11 and TM12 are equal.

In the example of FIG. 17 also, the sequencer 41 transmits different correction codes to the current sources 61 and 62. Specifically, the sequencer 41 transmits a correction code illustrated in the row c of FIG. 14 to the current source 61, and transmits a correction code illustrated in the row e of FIG. 14 to the current source 62. That is, the sequencer 41 reduces the amount of current drawn by the current source 61 than that in FIG. 15, and increases the amount of current drawn by the current source 62 than that in FIG. 15.

In such a case, as illustrated in FIG. 17, TM21 becomes longer than TM11, and TM22 becomes shorter than TM12. Consequently, since TM21 becomes longer than TM22, the duty cycle of the signal RE_c becomes greater than 50%, and thus, the duty cycle of the data strobe signal DQS generated based on such a signal also becomes greater than 50%.

As described above, the sequencer 41 can change the duty cycles of the signal RE_c, the data strobe signal DQS, and the like by individually adjusting the amounts of current drawn by the current sources 61 and 62 based on the correction codes.

In the present embodiment, the sequencer 41 is configured to adjust the correction code transmitted to each of the current sources 61 and 62 so that a duty cycle indicated by a signal received from the detection circuit 90 becomes close to the target value (e.g., 50%). It should be noted that the correspondence between a signal received by the sequencer 41 from the detection circuit 90 and a correction code transmitted to each of the current sources 61 and 62 from the sequencer 41 may be appropriately set according to a map created in advance, for example.

It should be noted that as is obvious from FIG. 13, the signals RE_in and RE_c are identical signals in practice as both of them are transmitted through the signal line SL3. However, for convenience's sake, the signal output from the receiving circuit 50 has been described as the signal RE_in and the signal output from the correction circuit 60 to the following stage has been described as the signal RE_c. This also holds true for the signals /RE_in and /RE_c transmitted through the signal line SL4.

Figure 24:
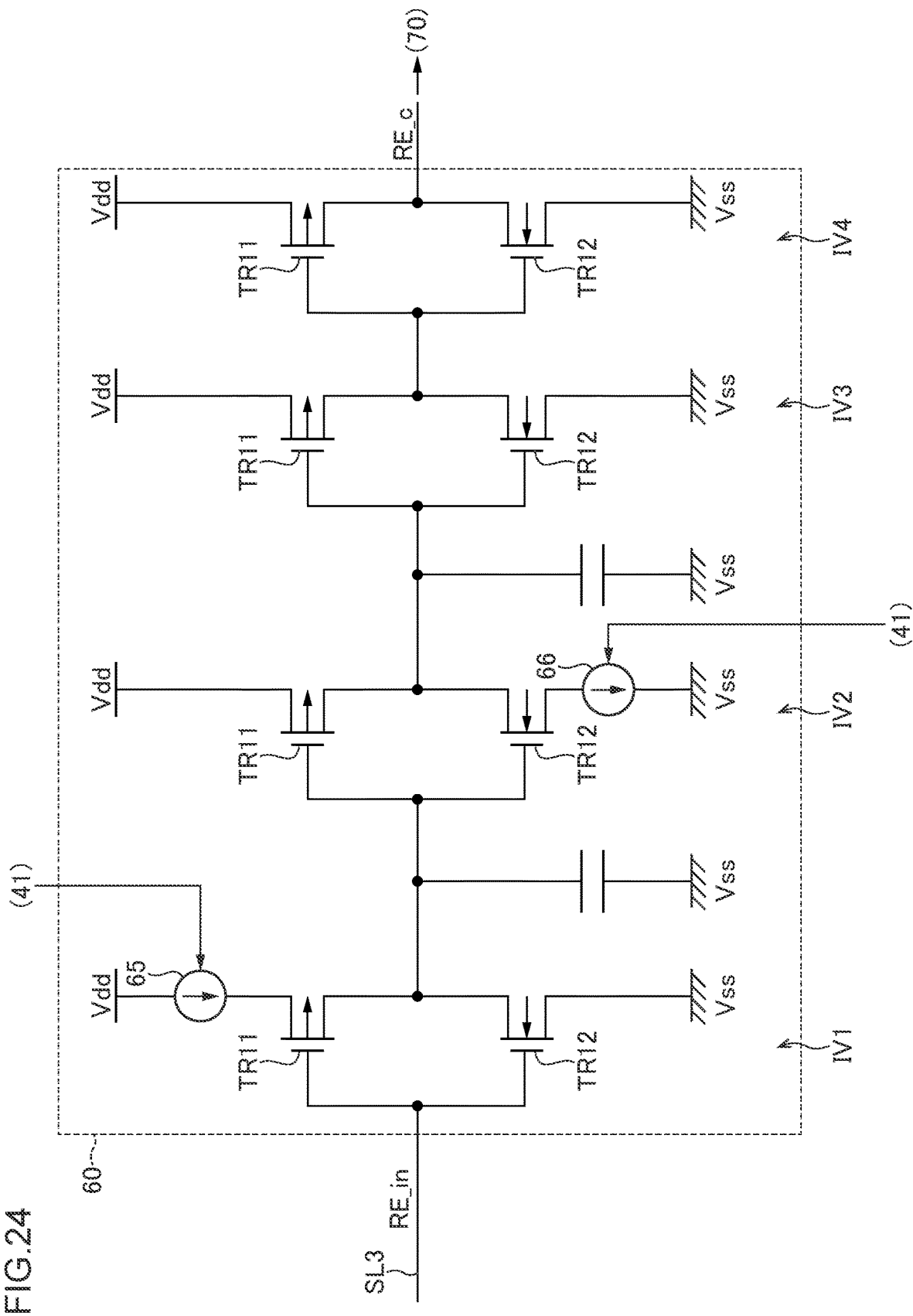
FIG. 24 is a diagram illustrating the configurations of a receiving circuit and a correction circuit in a semiconductor memory device according to a comparative example.

By the way, as the configuration of the correction circuit 60 for adjusting the duty cycles of the signal RE_in and the like, a configuration like the one of a comparative example illustrated in FIG. 24 is also contemplated. The correction circuit 60 according to the comparative example includes four inverters INV1, INV2, INV3, and INV4 connected in series. Each inverter includes a PMOS transistor TR11 and an NMOS transistor TR12. The inverter INV1 includes a variable current source 65 that supplies current to the transistor TR11 from the power supply line Vdd, and a variable current source 66 that supplies current to the ground line Vss from the transistor TR12. The amount of current output from each of the current sources 65 and 66 is individually adjusted based on a correction code transmitted from the sequencer 41.

The gate of each of the transistors TR11 and TR12 in the inverter INV1 receives the signal RE_in via the signal line SL3. The sequencer 41 can adjust the rise time of a toggle signal output from the inverter INV1 by transmitting a correction code to the current source 65. In addition, the sequencer 41 can adjust the fall time of a toggle signal output from the inverter INV2 by transmitting a correction code to the current source 66. It should be noted that the inverters INV3 and INV4 function as waveform-shaping circuits. The final-stage INV4 outputs the signal RE_c with the corrected duty cycle. According to such a configuration, the sequencer 41 can adjust the duty cycle of the signal RE_c output from the inverter INV4.

It should be noted that in the comparative example herein, the signal line SL4 is also provided with a correction circuit 60 similar to that in FIG. 24, and thus, the duty cycle of the signal /RE_in can be adjusted with the correction circuit 60.

In the configuration of the comparative example herein, a plurality of transistors TR11 and the like should be formed in the correction circuit 60. Thus, the area of the correction circuit 60 occupying the semiconductor memory device 2 is increased, resulting in an increased size of the semiconductor memory device 2. Further, another problem arises in that the amount of current consumed by the correction circuit 60 is also increased.

In contrast, in the correction circuit 60 according to the present embodiment, it is only necessary to provide the current sources 61 and 62 on the signal lines connecting to the comparator 51, and there is no need to provide additional transistors. Therefore, an increase in the size of the semiconductor memory device 2 can be suppressed. In addition, since each of the current sources 61 and 62 adds current to a signal output from the comparator 51, that is, a signal with a relatively small amplification factor, the amount of the output current can be suppressed. Accordingly, another effect of reducing power consumption can also be obtained.

It should be noted that in the present embodiment (FIG. 13), the current source 61 is connected to the signal line SL3, and the current source 62 is connected to the signal line SL4. Instead of such a configuration, it is also possible to provide a configuration in which a current source is connected to only one of the signal lines SL3 and SL4. Even with such a configuration, it is possible to adjust the current output from the current source, and thus change the duty cycles of the signal RE_c, the data strobe signal DQS, and the like.

Figure 18:
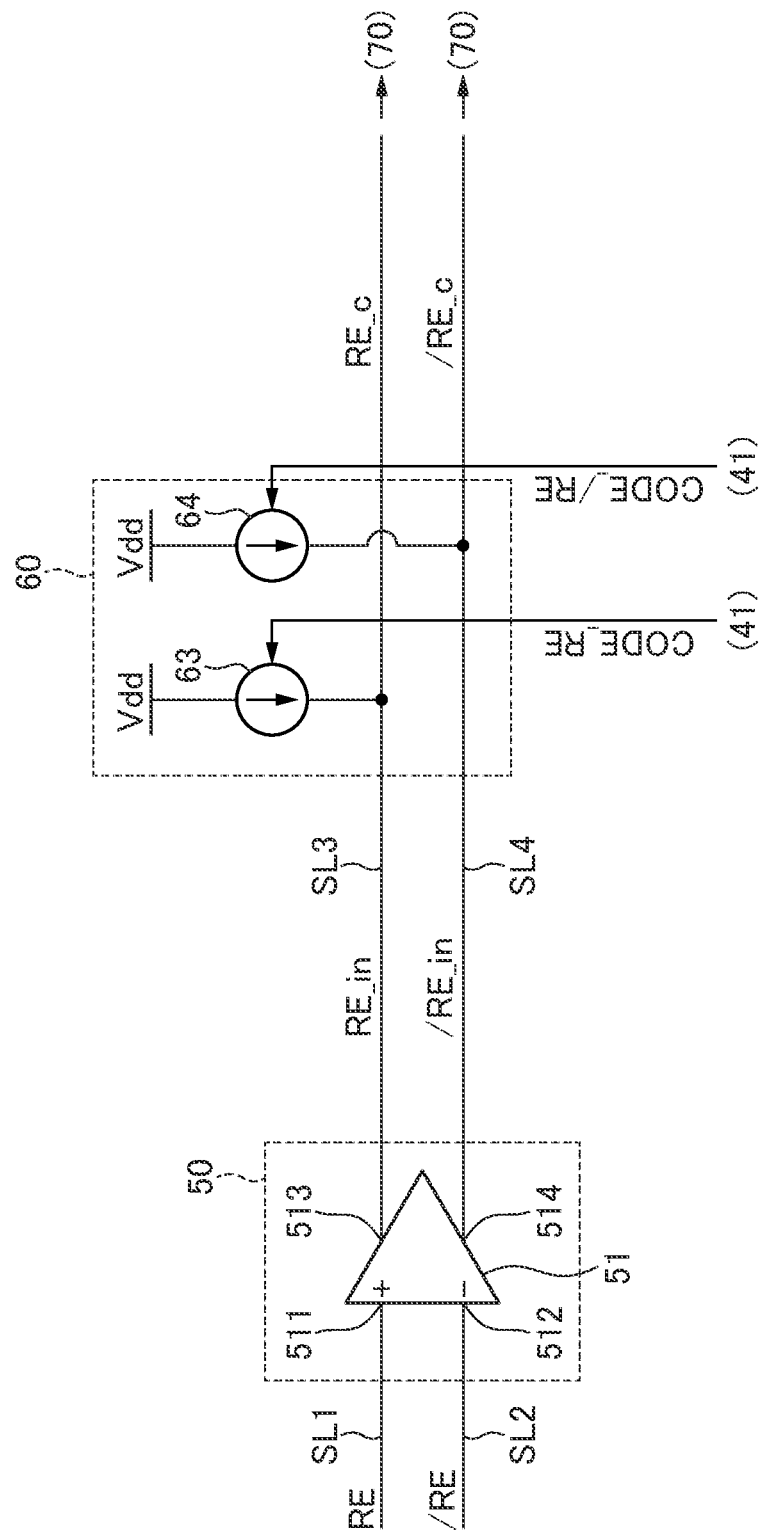
FIG. 18 is a diagram illustrating the configurations of a receiving circuit and a correction circuit in a semiconductor memory device according to a second embodiment.

A second embodiment will be described with reference to FIG. 18. The present embodiment differs from the first embodiment in the arrangement of the current sources.

In the present embodiment, a current source 63 with the same configuration as that of the current source 61 is connected between the signal line SL3 and the power supply line Vdd, and is configured to be able to adjust the amount of current flowing toward the signal line SL3. The amount of current output from the current source 63, that is, the amount of current drawn to the signal line SL3 from the current source 63 is adjusted based on a correction code (CODE_RE) transmitted from the sequencer 41.

Similarly, in the present embodiment, a current source 64 with the same configuration as that of the current source 62 is connected between the signal line SL4 and the power supply line Vdd, and is configured to be able to adjust the amount of current flowing toward the signal line SL4. The amount of current output from the current source 64, that is, the amount of current drawn to the signal line SL4 from the current source 64 is adjusted based on a correction code (CODE_/RE) transmitted from the sequencer 41.

Even with such a configuration, the sequencer 41 can individually adjust the amount of current drawn from each of the current sources 63 and 64, and thus can change the duty cycles of the signal RE_c, the data strobe signal DQS, and the like.

It should be noted that in the present embodiment, the current source 63 is connected to the signal line SL3, and the current source 64 is connected to the signal line SL4. Instead of such a configuration, it is also possible to provide a configuration in which a current source is connected to only one of the signal lines SL3 and SL4. Even with such a configuration, it is possible to adjust the current output from the current source, and thus change the duty cycles of the signal RE_c, the data strobe signal DQS, and the like.

Figure 19:
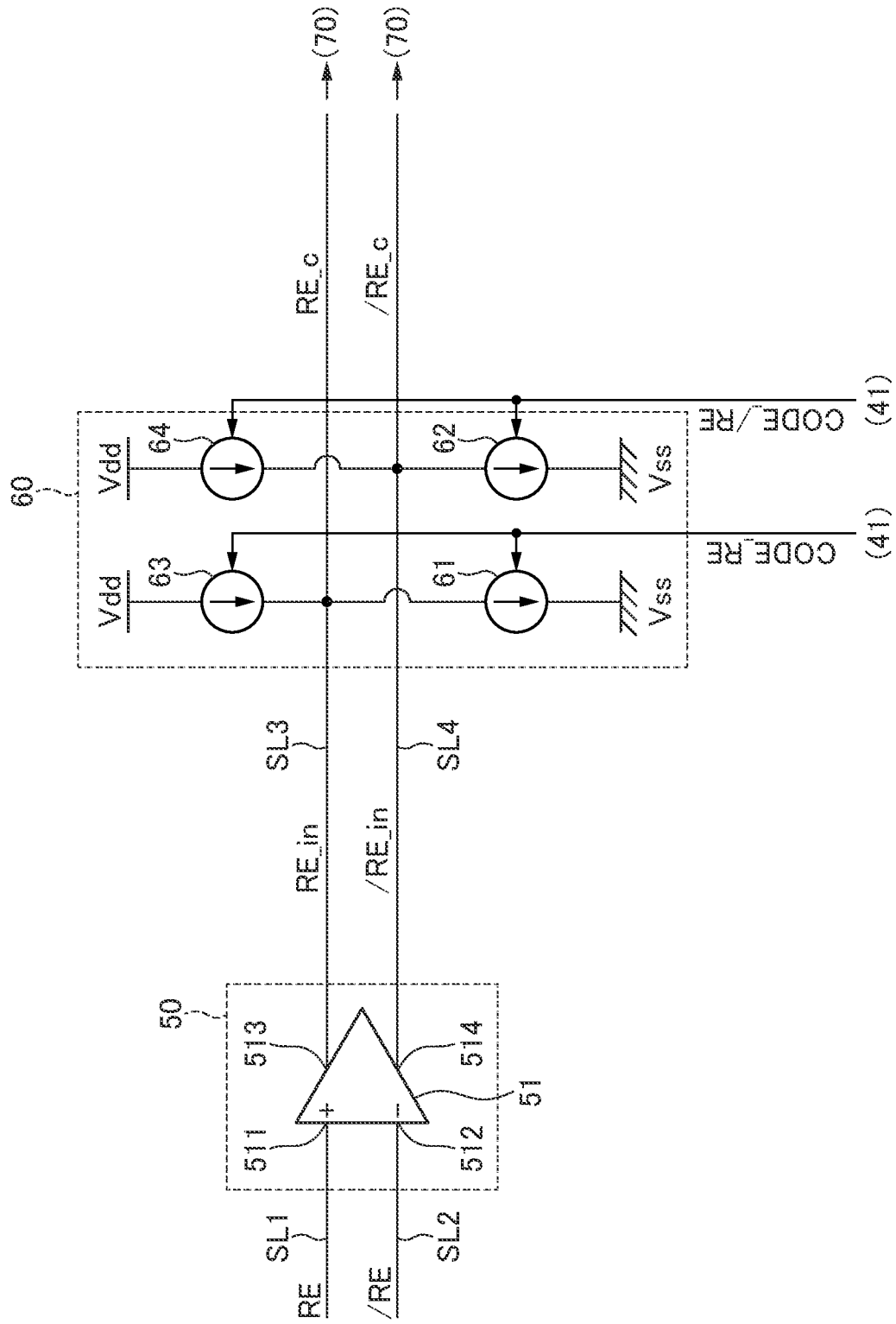
FIG. 19 is a diagram illustrating the configurations of a receiving circuit and a correction circuit in a semiconductor memory device according to a third embodiment.

A third embodiment will be described with reference to FIG. 19. The present embodiment differs from the first embodiment in the number and arrangement of current sources.

In the present embodiment, both current sources 61 and 62 similar to those in the first embodiment (FIG. 13) and current sources 63 and 64 similar to those in the second embodiment (FIG. 18) are provided. The sequencer 41 can individually adjust the amount of current output from each current source. Even with such a configuration, advantageous effects similar to those in the first and second embodiments can be achieved.

Figure 20:
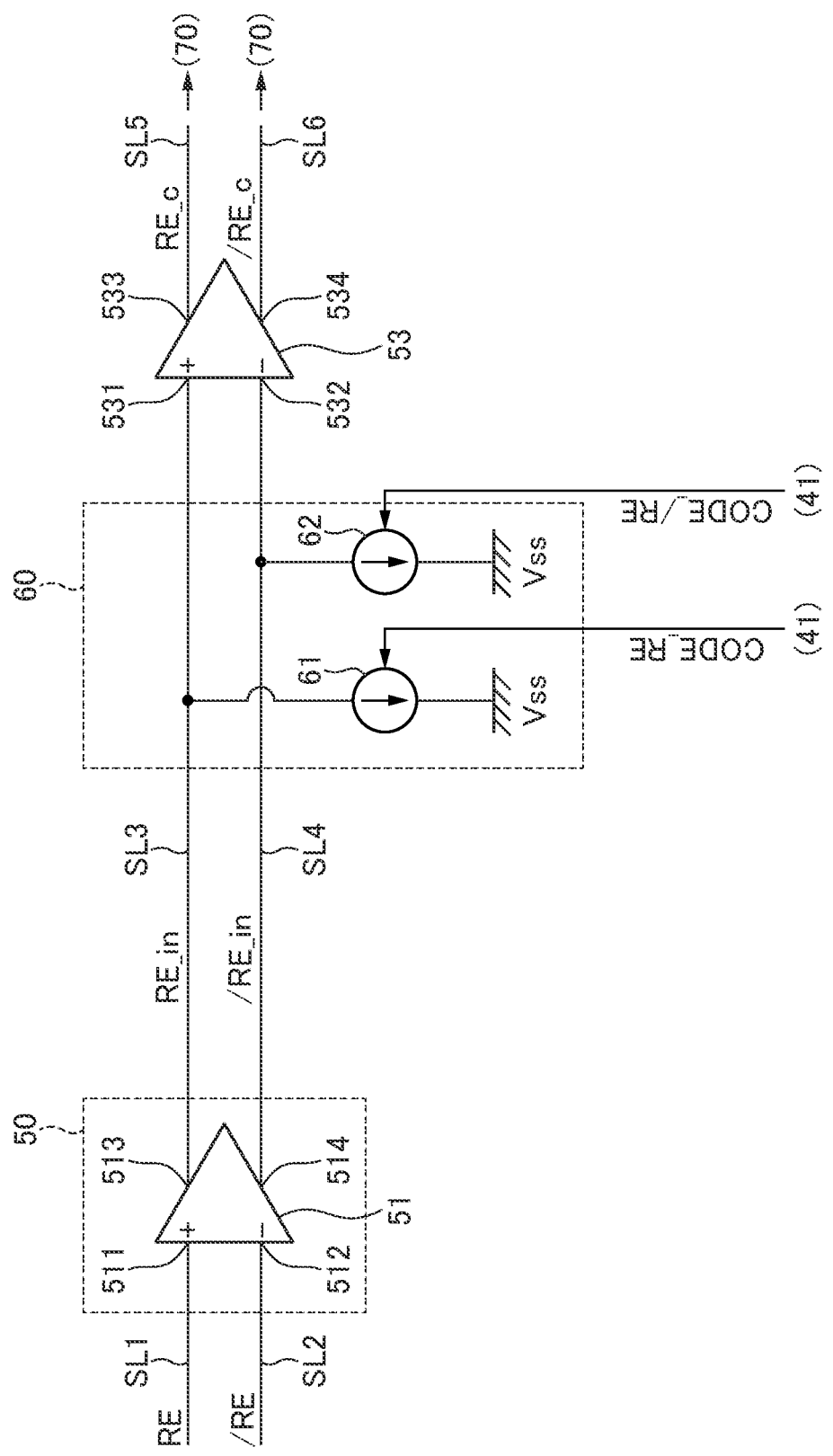
FIG. 20 is a diagram illustrating the configurations of a receiving circuit and a correction circuit in a semiconductor memory device according to a fourth embodiment.

A fourth embodiment will be described with reference to FIG. 20. As illustrated in FIG. 20, in the present embodiment, a comparator 53 is provided at positions of the signal lines SL3 and SL4 on the stage following the correction circuit 60.

The configuration of the comparator 53 is the same as that of the comparator 51. The comparator 53 includes a first input portion 531, a second input portion 532, a first output portion 533, and a second output portion 534 as with the comparator 51.

The signal line SL3 is connected to the first input portion 531, and the signal line SL4 is connected to the second input portion 532. An end portion of a signal line SL5 extending toward the output control circuit 70 is connected to the first output portion 533, and an end portion of a signal line SL6 extending toward the output control circuit 70 is connected to the second output portion 534.

When the signal RE_in input to the comparator 53 is at a level higher than the signal /RE_in, the comparator 53 outputs the signal /RE_c at the H level from the second output portion 534, and also outputs the signal RE_c at the L level from the first output portion 533. In other cases, the comparator 53 outputs the signal /RE_c at the L level from the second output portion 534, and also outputs the signal RE_c at the H level from the first output portion 533.

The comparator 53 receives the signal RE_in (i.e., the third toggle signal) and the signal /RE_in (i.e., the fourth toggle signal) as described above. The current sources 61 and 62 of the present embodiment are respectively connected to the signal lines SL3 and SL4 connecting the comparator 51 and the comparator 53. The comparator 53 corresponds to a "second comparator" in the present embodiment. Even with such a configuration including the comparator 53, advantageous effects similar to those described in the first embodiment and the like can be achieved. It should be noted that the comparator 53 may also be provided in the configuration of the second embodiment (FIG. 18) or the configuration of the third embodiment (FIG. 19).

Figure 21:
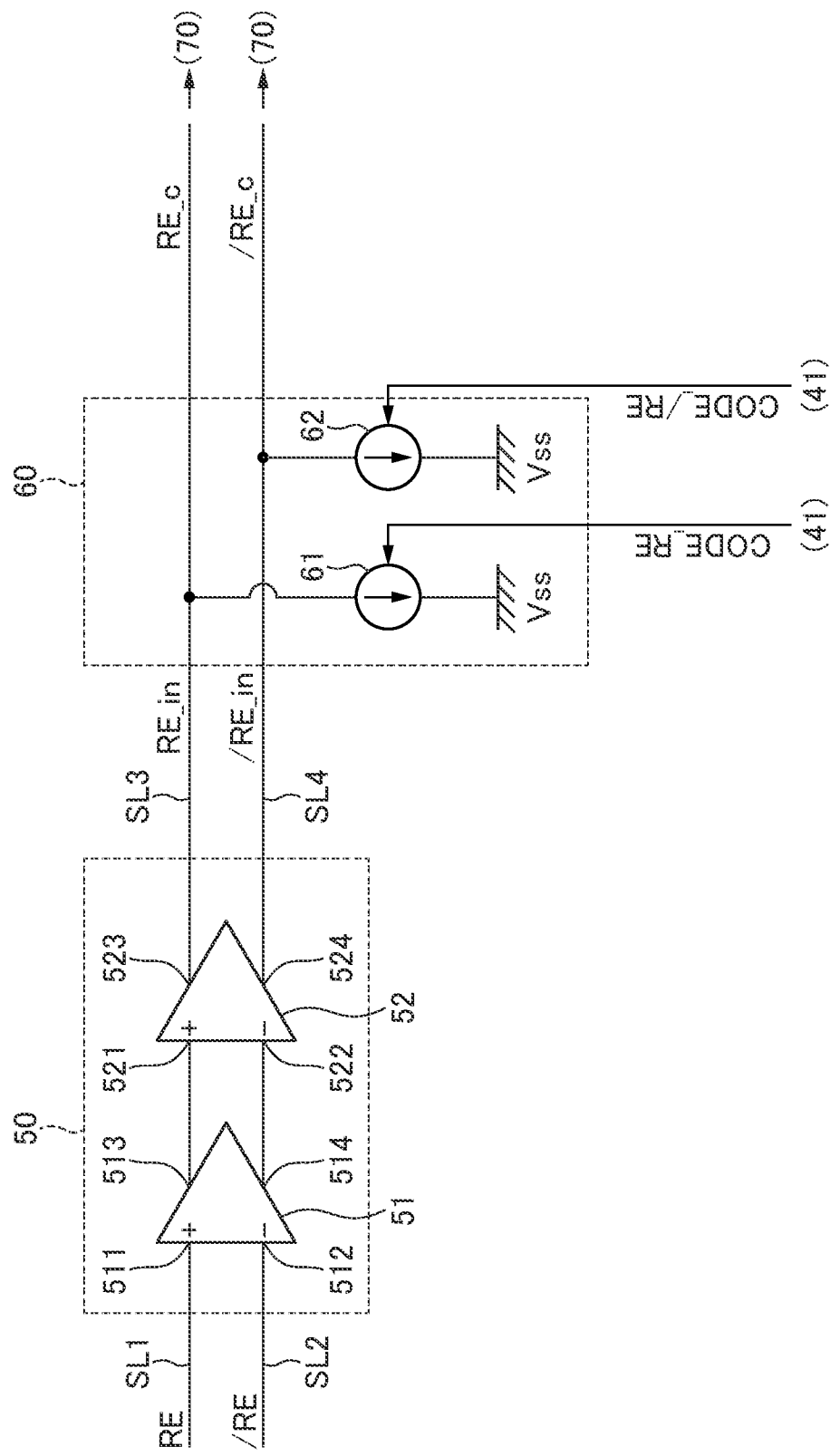
FIG. 21 is a diagram illustrating the configurations of a receiving circuit and a correction circuit in a semiconductor memory device according to a fifth embodiment.

A fifth embodiment will be described with reference to FIG. 21. As illustrated in FIG. 21, in the present embodiment, the receiving circuit 50 includes two comparators 51 and 52 connected in series.

The configuration of the comparator 52 is the same as that of the comparator 51. The comparator 52 includes a first input portion 521, a second input portion 522, a first output portion 523, and a second output portion 524 as with the comparator 51.

A signal line extending from the first output portion 513 is connected to the first input portion 521, and a signal line extending from the second output portion 514 is connected to the second input portion 522. An end portion of the signal line SL3 extending toward the correction circuit 60 and the output control circuit 70 is connected to the first output portion 523, and an end portion of the signal line SL4 extending toward the correction circuit 60 and the output control circuit 70 is connected to the second output portion 524. In this manner, even with a configuration in which the receiving circuit 50 includes a plurality of comparators, advantageous effects similar to those described in the first embodiment and the like can be achieved. The number of comparators in the receiving circuit 50 may be more than two. It should be noted that the configuration in which the receiving circuit 50 includes a plurality of comparators may be combined with the configuration of the second embodiment (FIG. 18), the third embodiment (FIG. 19), or the fourth embodiment (FIG. 20).

Figure 22:
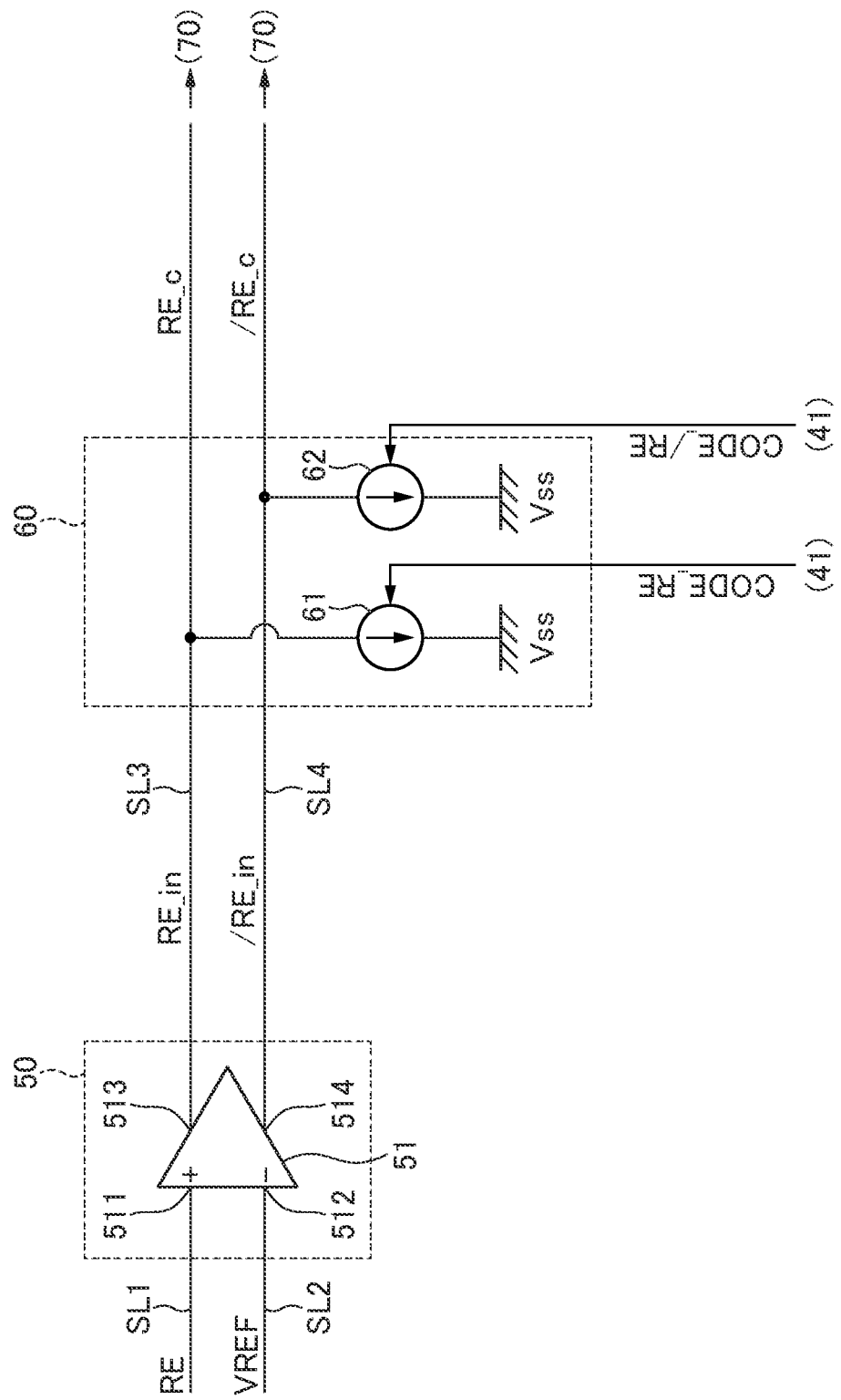
FIG. 22 is a diagram illustrating the configurations of a receiving circuit and a correction circuit in a semiconductor memory device according to a sixth embodiment.

A sixth embodiment will be described with reference to FIG. 22. In the present embodiment, a signal VREF with a constant voltage is input as a reference signal to the second input portion 512 of the comparator 51. The signal VREF is a signal at a level intermediate between the H level and the L level, for example, and is a signal generated in the semiconductor memory device 2, specifically, in the voltage generation circuit 43. Even with such a configuration, advantageous effects similar to those described in the first embodiment can be achieved. A signal with a constant voltage may also be input as a reference signal in each of the aforementioned embodiments as in the present embodiment.

Figure 23:
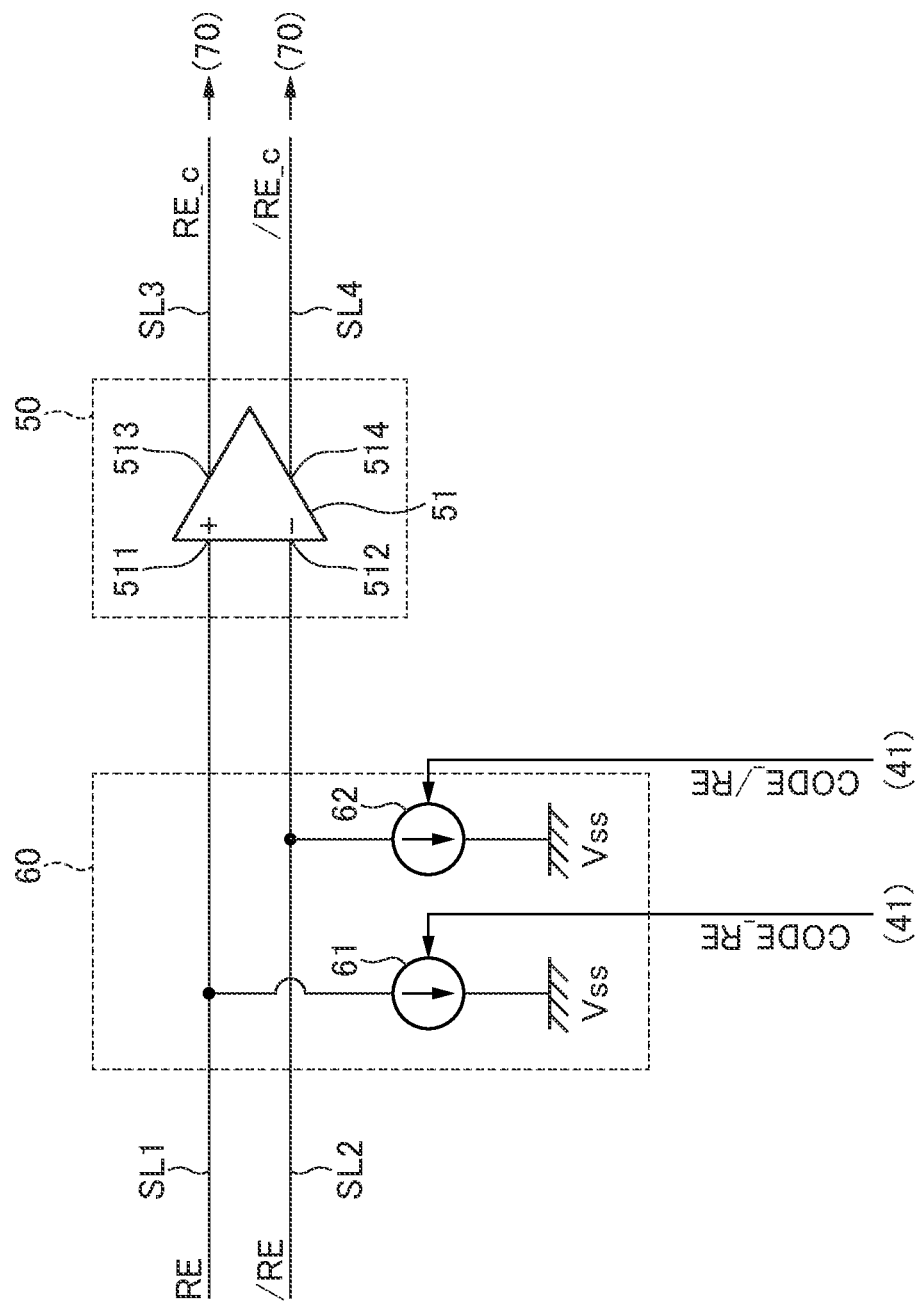
FIG. 23 is a diagram illustrating the configurations of a receiving circuit and a correction circuit in a semiconductor memory device according to a seventh embodiment.

A seventh embodiment will be described with reference to FIG. 23. As illustrated in FIG. 23, in the present embodiment, the read enable signals /RE and RE are first input to the correction circuit 60, and then, the signals corrected by the correction circuit 60 are input to the comparator 51 of the receiving circuit 50. That is, the receiving circuit 50 and the correction circuit 60 in the first embodiment (FIG. 13) are swapped with each other. Even with such a configuration, advantageous effects similar to those described in the first embodiment can be achieved.

It should be noted that in the present embodiment, a current source 61 is connected to the signal line SL1, and a current source 62 is connected to the signal line SL2. Instead of such a configuration, it is also possible to provide a configuration in which a current source is connected to only one of the signal lines SL1 and SL2. Even with such a configuration, it is possible to adjust the current output from the current source, and thus change the duty cycles of the signal RE_c, the data strobe signal DQS, and the like.

As described in each of the embodiments, the variable current source 61 or the like has only to be connected to at least one of the first input portion 511, the second input portion 512, the first output portion 513, and the second output portion 514 of the comparator 51.

Although the present embodiment has been described with reference to specific examples, the present disclosure is not limited thereto. Such specific examples are, even when some design changes are appropriately made thereto by one of ordinary skill in the art, also included in the scope of the present disclosure as long as the resulting design includes the features of the present disclosure. The components, their arrangement, conditions, shapes, and the like in each of the aforementioned specific examples are not limited to those exemplarily illustrated above, and can be changed as appropriate. A combination of the components in each of the aforementioned specific examples can be changed as appropriate unless any technical contradiction occurs.

What is claimed is:

1. A semiconductor memory device comprising:
   a receiving unit that receives a first toggle signal from outside;
   a first comparator that generates a second toggle signal switched in synchronism with the first toggle signal, and outputs the second toggle signal;
   an adjustment unit that adjusts a duty cycle of the second toggle signal; and
   a transmitting unit that transmits to the outside the second toggle signal with the adjusted duty cycle or a toggle signal generated based on the second toggle signal,
   wherein:
   the second toggle signal output from the first comparator includes a third toggle signal and a fourth toggle signal as a signal complementary to the third toggle signal,
   the first comparator includes
      a first input portion that receives the first toggle signal,
      a second input portion that receives a reference signal,
      a first output portion that outputs the third toggle signal switched according to a magnitude relationship between the first toggle signal and the reference signal, and
      a second output portion that outputs the fourth toggle signal,
   the adjustment unit includes a variable current source connected to at least one of the first input portion, the second input portion, the first output portion, and the second output portion, and
   the adjustment unit adjusts an amount of current output from the current source to adjust a duty cycle of the second toggle signal.

2. The semiconductor memory device according to claim 1, wherein the reference signal is a signal received from the outside as a signal complementary to the first toggle signal.

3. The semiconductor memory device according to claim 1, wherein the reference signal is a signal with a constant voltage.

4. The semiconductor memory device according to claim 1, wherein the current source is connected to at least one of the first output portion and the second output portion.

5. The semiconductor memory device according to claim 4, further comprising a second comparator that receives the third toggle signal and the fourth toggle signal,
   wherein:
   the current source is connected to a signal line connecting the first comparator and the second comparator.

6. The semiconductor memory device according to claim 1, wherein the current source is configured to change an amount of current flowing between a power supply line and a signal line connecting to the first comparator.

7. The semiconductor memory device according to claim 1, wherein the current source is configured to change an amount of current flowing between a ground line and a signal line connecting to the first comparator.

8. The semiconductor memory device according to claim 1, configured as a NAND flash memory.

9. The semiconductor memory device according to claim 1, wherein the receiving unit receives the first toggle signal from an external memory controller.

10. The semiconductor memory device according to claim 1, wherein the transmitting unit transmits to an external memory controller the second toggle signal with the adjusted duty cycle or the toggle signal generated based on the second toggle signal.

11. The semiconductor memory device according to claim 1, further comprising a sequencer,
    wherein:
    the current source includes
       a first current source connected to the first output portion, and
       a second current source connected to the second output portion, and
    the sequencer transmits a first correction signal to the first current source, and transmits a second correction signal to the second current source.

12. The semiconductor memory device according to claim 11,
    wherein:
    each of the first current source and the second current source includes a plurality of current source circuits connected in parallel and having different output current values,
    the first correction signal switches ON/OFF of each of the plurality of current source circuits in the first current source, and
    the second correction signal switches ON/OFF of each of the plurality of current source circuits in the second current source.

13. The semiconductor memory device according to claim 11,
    wherein:
    the first current source is connected between the first output portion and a ground line, and
    the second current source is connected between the second output portion and the ground line.

14. The semiconductor memory device according to claim 11,
    wherein:
    the first current source is connected between the first output portion and a power supply line, and
    the second current source is connected between the second output portion and the power supply line.

15. The semiconductor memory device according to claim 13,
    wherein:
    the current source further includes
       a third current source connected to the first output portion and connected between the first output portion and a power supply line, and
       a fourth current source connected to the second output portion and connected between the second output portion and the power supply line,
    each of the third current source and the fourth current source includes a plurality of current source circuits connected in parallel and having different output current values,
    the first correction signal is supplied to the plurality of current source circuits in the first current source and the plurality of current source circuits in the third current source, and
    the second correction signal is supplied to the plurality of current source circuits in the second current source and the plurality of current source circuits in the fourth current source.

* * * * *